(12) United States Patent
Zhang et al.

(10) Patent No.: US 9,390,739 B1
(45) Date of Patent: *Jul. 12, 2016

(54) PIEZOELECTRIC MICROACTUATOR WITH RESTRAINING LAYER FOR CONTROL OF BENDING

(71) Applicant: Magnecomp Corporation, Murrieta, CA (US)

(72) Inventors: Long Zhang, Murrieta, CA (US); Peter Hahn, Wildomar, CA (US); Kuen Chee Ee, Chino, CA (US)

(73) Assignee: MAGNECOMP CORPORATION, Murrieta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/800,645

(22) Filed: Jul. 15, 2015

Related U.S. Application Data

(63) Continuation of application No. 14/214,525, filed on Mar. 14, 2014, now Pat. No. 9,117,468.

(51) Int. Cl.
   *G11B 5/48* (2006.01)

(52) U.S. Cl.
   CPC ............ *G11B 5/4873* (2013.01); *G11B 5/4846* (2013.01); *G11B 5/48* (2013.01); *G11B 5/483* (2015.09); *G11B 5/4806* (2013.01)

(58) Field of Classification Search
   None
   See application file for complete search history.

(56) References Cited

U.S. PATENT DOCUMENTS

| | | | |
|---|---|---|---|
| 3,390,287 A | 6/1968 | Sonderegger | |
| 4,088,915 A | 5/1978 | Kodama | |
| 4,310,730 A | 1/1982 | Aaroe | |
| 4,769,570 A | 9/1988 | Yokoyama et al. | |
| 5,376,860 A | 12/1994 | Sato | |
| 5,485,053 A * | 1/1996 | Baz | 310/326 |
| 5,632,841 A | 5/1997 | Hellbaum et al. | |
| 5,831,371 A | 11/1998 | Bishop | |
| 5,849,125 A | 12/1998 | Clark | |
| 5,861,702 A | 1/1999 | Bishop et al. | |
| 6,060,811 A | 5/2000 | Fox et al. | |
| 6,172,446 B1 * | 1/2001 | Kanayama et al. | 310/348 |
| 6,245,172 B1 | 6/2001 | Face, Jr. | |
| 6,278,587 B1 * | 8/2001 | Mei | 360/294.6 |

(Continued)

FOREIGN PATENT DOCUMENTS

JP 198354920 A 10/1984

OTHER PUBLICATIONS

Batra, R.C. and Geng, T.S., Enhancement of the Dynamic Buckling Load for a Plate by Using Piezoeceramic Actuators, Smart Matererials and Structures (2001), vol. 10, pp. 925-933.

(Continued)

*Primary Examiner* — Carlos E Garcia
(74) *Attorney, Agent, or Firm* — Intellectual Property Law Offices of Joel Voelzke, APC

(57) ABSTRACT

A PZT microactuator such as for use in a hard disk drive has a restraining layer bonded on its side that is opposite the side on which the PZT will be mounted. The restraining layer comprises a stiff and resilient material such as stainless steel. The restraining layer can cover all of the top of the PZT, or most of the top of the PZT with an electrical connection being made to the PZT where it is not covered by the restraining layer. The restraining layer reduces bending of the PZT as mounted and hence increases effective stroke length, or reverses the sign of the bending which increases the effective stroke length of the PZT even further.

22 Claims, 18 Drawing Sheets

(56) References Cited

U.S. PATENT DOCUMENTS

| | | | |
|---|---|---|---|
| 6,333,681 B1 | 12/2001 | Takeuchi et al. | |
| 6,421,211 B1* | 7/2002 | Hawwa et al. | 360/294.4 |
| 6,472,799 B2 | 10/2002 | Takeuchi et al. | |
| 6,476,538 B2 | 11/2002 | Takeuchi et al. | |
| 6,512,323 B2 | 1/2003 | Forck et al. | |
| 6,538,854 B2 | 3/2003 | Koganezawa et al. | |
| 6,605,887 B2 | 8/2003 | Takeuchi et al. | |
| 6,618,220 B2* | 9/2003 | Inagaki et al. | 360/78.05 |
| 6,636,387 B2* | 10/2003 | Kikkawa et al. | 360/294.3 |
| 6,643,902 B2 | 11/2003 | Takeuchi et al. | |
| 6,762,536 B2 | 7/2004 | Hoffmann et al. | |
| 6,812,594 B2 | 11/2004 | Face et al. | |
| 6,817,072 B2 | 11/2004 | Takeuchi et al. | |
| 6,847,155 B2 | 1/2005 | Schwartz et al. | |
| 7,126,497 B2 | 10/2006 | Face et al. | |
| 7,164,221 B1 | 1/2007 | Takeuchi et al. | |
| 7,218,481 B1* | 5/2007 | Bennin et al. | 360/294.4 |
| 7,245,064 B2 | 7/2007 | Takeuchi et al. | |
| 7,336,021 B2 | 2/2008 | Takeuchi et al. | |
| 7,358,647 B2 | 4/2008 | Takeuchi et al. | |
| 7,368,860 B2 | 5/2008 | Wood et al. | |
| 7,440,236 B1 | 10/2008 | Bennin et al. | |
| 7,595,965 B1* | 9/2009 | Kulangara et al. | 360/294.6 |
| 7,652,412 B2 | 1/2010 | Nihei | |
| 7,692,559 B2 | 4/2010 | Face et al. | |
| 7,746,279 B2 | 6/2010 | McGovern et al. | |
| 7,983,008 B2* | 7/2011 | Liao et al. | 360/294.4 |
| 8,004,159 B2 | 8/2011 | Niehi | |
| 8,148,791 B1* | 4/2012 | Holaway | 257/415 |
| 8,189,296 B2 | 5/2012 | Hata | |
| 8,189,301 B2* | 5/2012 | Schreiber | 360/294.4 |
| 8,570,688 B1* | 10/2013 | Hahn et al. | 360/294.4 |
| 8,680,749 B2 | 3/2014 | Xu et al. | |
| 8,681,456 B1 | 3/2014 | Miller et al. | |
| 8,780,503 B2 | 7/2014 | Wright et al. | |
| 8,810,113 B2 | 8/2014 | Han et al. | |
| 9,318,136 B1 | 4/2016 | Bjorstrom et al. | |
| 2002/0063496 A1 | 5/2002 | Forck et al. | |
| 2004/0095663 A1* | 5/2004 | Kuwajima et al. | 360/4 |
| 2007/0222339 A1* | 9/2007 | Lukacs et al. | 310/335 |
| 2010/0195251 A1* | 8/2010 | Nojima et al. | 360/245.3 |
| 2014/0104722 A1 | 4/2014 | Wright et al. | |

OTHER PUBLICATIONS

Luo, Quantian and Tong, Liyong, Exact Static Solutions to Piezoelectric Smart Beams Including Peel Stresses, International Journal of Solids and Structures (2009), vol. 39, pp. 4677-4695.

Finio, Benjamin M. and Wood, Robert J., Optimal Energy Density Piezoelectric Twising Actuators, 2011 IEEE/RJS International Conference on Intelligent Robots and Systems, Sep. 25-30, 2011, p. 384-389.

Smits, Jan G. and Dalke, Susan I., The Constituent Equations of Piezoelectric Bimorphs, IEEE 1989 Ultrasonics Symposium, pp. 781-784.

Capozzoli, M. et al., Modeling Aspects Concerning THUNDER Actuators, Proceedings of the SPIE, Smart Structures and Materials 1999, vol. 3667, pp. 719-727.

Aimmanee, Sontipee, Deformation and Force Characteristics of Laminated Piezoelectric Actuators, Dissertation at Virginia Polytechnic Institute and State University, 2004.

Phillips, James R., Piezoelectric Technology Primer, date unknown, CTS Wireless Components, Aluquerque, New Mexico, retrieved in 2015 from http://www.ctscorp.com/components/pzt/downloads/Piezoelectric_Technology.pdf, esp. pp. 8-11.

PI Ceramic GmbH (Germany), Displacement Modes of Piezoelectric Actuators, © 1996-2015, retrieved in 2015 from http://piceramic.com/piezo-technology/properties-piezo-actuators/displacement-modes.html, esp. p. 4 ff.

Kim, Sunghwan, Low Power Energy Harvesting with Piezoelectric Generators, PhD Thesis, 2002, University of Pittsburgh, esp. Fig. 27 (p. 51) and related discussion.

U.S. Appl. No. 14/214,525, Hard Disk Drive Suspension Microactuator with Restraining Layer for Control of Bending, Issued as: U.S. Pat. No. 9,177,468.

U.S. Appl. No. 14/566,666, HDD Microactuator Having Reverse Poling and Active Restraining Layer, Office Action May 27, 2015: Claims 1,4,6,9,14,18,21 and 22 are rejected; Claims 7,8,19 and 20 are objected to. Amendment filed Jul. 24, 2015.

U.S. Appl. No. 14/620,120, Suspension Microactuator with Wrap-Around Electrode on Inactive Constraining Layer, Issued: U.S. Pat. No. 9,070,394.

U.S. Appl. No. 14/672,122, DSA Suspension Having Multi-Layer PZT Microactuator with Active PZT Constraining Layer, Amendment filed Sep. 17, 2015.

U.S. Appl. No. 14/720,827, Piezoelectric Actuator with Wrap-Around Electrode on Inactive Constraining Layer, Non-Final Rejection Oct. 2, 2015.

Amendment filed on Sep. 17, 2015 in U.S. Appl. No. 14/672,122.

Non-Final Rejection dated Oct. 2, 2015 in U.S. Appl. No. 14/720,827.

U.S. Appl. No. 14/214,525, Hard Disk Drive Suspension Microactuator with Restraining Layer for Control of Bending, Issued as: U.S. Pat. No. 9,117,468.

U.S. Appl. No. 14/814,676, DSA Suspension Having PZT with Overhanging Constraint Layer and Electrical Connection Thereto, Will issue on May 3, 2016 as: U.S. Pat. No. 9,330,696.

U.S. Appl. No. 14/566,666, HDD Microactuator Having Reverse Poling and Active Restraining Layer, Will issue on May 3, 2016 as: U.S. Pat. No. 9,330,694.

U.S. Appl. No. 14/620,120, Suspension Microactuator with Wrap-Around Electrode on Inactive Constraining Layer, Issued as: U.S. Pat. No. 9,070,394.

U.S. Appl. No. 14/672,122, DSA Suspension Having Multi-Layer PZT Microactuator with Active PZT Constraining Layer, Will issue on May 3, 2016 as: U.S. Pat. No. 9,330,698.

U.S. Appl. No. 14/720,827, Piezoelectric Actuator with Wrap-Around Electrode on Inactive Constraining Layer, Will issue on May 3, 2016 as: U.S. Pat. No. 9,330,699.

U.S. Appl. No. 15/055,618, Multi-Layer PZT Microactuator with Active PZT Constraining Layer for a DSA Suspension, awaiting examination.

U.S. Appl. No. 15/055,633, Multi-Layer PZT Microactuator with Active PZT Constraining Layer for a DSA Suspension, awaiting examination.

\* cited by examiner

PIEZOELECTRIC MICROACTUATOR WITH RESTRAINING LAYER FOR CONTROL OF BENDING

CROSS-REFERENCE TO RELATED APPLICATIONS

This application claims priority from provisional patent application Nos. 61/802,972 filed Mar. 18, 2013, and 61/877,957 filed Sep. 14, 2013, the disclosures of which are hereby incorporated by reference in their entireties.

BACKGROUND OF THE INVENTION

1. Field of the Invention

This invention relates to the field of suspensions for hard disk drives. More particularly, this invention relates to the field of a piezoelectric microactuator for a disk drive suspension, the microactuator having a restraining layer bonded thereto to reduce or control bending of the microactuator upon actuation.

2. Description of Related Art

Magnetic hard disk drives and other types of spinning media drives such as optical disk drives are well known. FIG. 1 is an oblique view of an exemplary prior art hard disk drive and suspension for which the present invention is applicable. The prior art disk drive unit 100 includes a spinning magnetic disk 101 containing a pattern of magnetic ones and zeroes on it that constitutes the data stored on the disk drive. The magnetic disk is driven by a drive motor (not shown). Disk drive unit 100 further includes a disk drive suspension 105 to which a magnetic head slider (not shown) is mounted proximate the distal end of load beam 107. The "proximal" end of a suspension or load beam is the end that is supported, i.e., the end nearest to base plate 12 which is swaged or otherwise mounted to an actuator arm. The "distal" end of a suspension or load beam is the end that is opposite the proximal end, i.e., the "distal" end is the cantilevered end.

Suspension 105 is coupled to an actuator arm 103, which in turn is coupled to a voice coil motor 112 that moves the suspension 105 arcuately in order to position the head slider over the correct data track on data disk 101. The head slider is carried on a gimbal which allows the slider to pitch and roll so that it follows the proper data track on the spinning disk, allowing for such variations as vibrations of the disk, inertial events such as bumping, and irregularities in the disk's surface.

Both single stage actuated disk drive suspensions and dual stage actuated (DSA) suspension are known. In a single stage actuated suspension, only the voice coil motor 112 moves suspension 105.

In a DSA suspension, as for example in U.S. Pat. No. 7,459,835 issued to Mei et al. as well as many others, in addition to a voice coil motor 112 which moves the entire suspension, at least one additional microactuator is located on the suspension in order to effect fine movements of the magnetic head slider and to keep it properly aligned over the data track on the spinning disk. The microactuator(s) provide finer control and much higher bandwidth of the servo control loop than does the voice coil motor alone, which only effects relatively coarse movements of the suspension and hence the magnetic head slider. A piezoelectric element, sometimes referred to simply as a PZT, is often used as the microactuator motor, although other types of microactuator motors are possible.

FIG. 2 is a top plan view of the prior art suspension 105 in FIG. 1. Two PZT microactuators 14 are affixed to suspension 105 on microactuator mounting shelves 18 that are formed within base plate 12, such that the PZTs span respective gaps in base plate 12. Microactuators 14 are affixed to mounting shelves 18 by epoxy 16 at each end of the microactuators. The positive and negative electrical connections can be made from the PZTs to the suspension's flexible wiring trace and/or to the plate by a variety of techniques. When microactuator 14 is activated, it expands or contracts and thus changes the length of the gap between the mounting shelves thereby producing fine movements of the read/write head that is mounted at the distal end of suspension 105.

FIG. 3 is a side sectional view of the prior art PZT microactuator and mounting of FIG. 2. Microactuator 14 includes the PZT element 20 itself, and top and bottom metalized layers 26, 28 on the PZT which define electrodes for actuating the PZT. PZT 14 is mounted across a gap by epoxy or solder 16 on both its left and right sides as shown in the figure.

In DSA suspensions it is generally desirable to achieve a high stroke distance from the PZT per unit of input voltage, or simply "stroke length" for short.

Many DSA suspension designs in the past have mounted the PZTs at the mount plate. In such a design, the linear movement of the PZTs is magnified by the length of the arm between the rotation center of the PZTs and the read/write transducer head. A small linear movement of the PZTs therefore results in a relatively large radial movement of the read/write head.

Other suspension designs mount the PZT at or near the gimbal. An example of a gimbal-mounted PZT is the DSA suspension shown in co-pending U.S. application Ser. No. 13/684,016 which is assigned to the assignee of the present invention. In a gimbal-mounted DSA suspension (a "GSA" suspension) it is particularly important to achieve high stroke length, because those designs do not have nearly as long an arm length between the PZTs and the read/write transducer head. With a shorter arm length, the resulting movement of the read/write head is correspondingly less. Thus, achieving a large stroke length is particularly important in GSA design.

SUMMARY OF THE INVENTION

The inventors of the application have identified a source of lost PZT stroke length in a suspension having a PZT microactuator mounted thereto according to the prior art, and have developed a PZT microactuator structure and method of producing it that eliminates the source of that lost stroke length.

FIG. 4A is a side sectional view of a PZT microactuator 14 mounted in a suspension according to prior art FIG. 2, when the PZT is actuated by a driving voltage applied thereto in order to expanded the PZT. Because the bottom layer 22 of the PZT is partially constrained by being bonded to the suspension 18 on which it is mounted, the bottom layer 22 does not expand in a linear direction as much as does the top layer 24. Because the top layer 24 expands more than does the bottom layer 22, the PZT 14 bends downward and assumes a slightly convex shape when viewed from the top. The resulting loss in linear stroke length is shown in the figure as δ1.

FIG. 4B shows the PZT microactuator 14 of FIG. 4A when the PZT is actuated by a driving voltage applied thereto to contract the PZT. Because the bottom layer 22 of the PZT is partially constrained by being bonded to the suspension 18 on which it is mounted, the bottom layer 22 does not contract in a linear direction as much as does the top layer 24. Because the top layer 24 contracts more than does the bottom layer 22, the PZT 14 bends upward and assumes a slightly concave shape when viewed from the top. The resulting loss in linear stroke length is shown in the figure as δ2.

Thus, although purely linear expansion and contraction of the PZT upon actuation is desired, in the conventional mounting the PZT experiences bending either up or down which results in lost stroke length.

FIG. 5 is a diagram and an associated equation for the amount of effective linear stroke added or lost due to bending of a PZT. When the beam bends up as shown in FIG. 4A the bottom tip point will have a positive displacement δ in the x-direction when the bending angle is small.

FIG. 6 is a plot of stroke loss due to bending verses bending angle for three different thicknesses of PZTs. As shown in the figure, for a PZT with a length of 1.50 mm and a thickness of 45 μm, the bending causes a positive x-displacement δ when the bending angle is less than 5 degrees. For that amount of bending, it can also been seen that thicker beams produce greater x-displacement than do thinner beams. Similarly, when the PZT contracts under the applied voltage, the right half of the PZT bends downward, and the bottom tip of the PZT which is bonded to the suspension will experience a negative x-displacement. In other words, in the conventional mounting of a PZT onto a suspension, the component δ of linear displacement due to bending is in the opposite direction as the actuation of the PZT. It would therefore be desirable to reduce or eliminate that delta, or to even reverse the sign of that delta so that the net result is that the amount of total linear expansion or contraction is actually increased.

The present invention is of a PZT element that has one or more stiff restraining layers or restraining elements bonded onto at least one side or face opposite the side or face on which the PZT is mounted to the suspension, in order to reduce, eliminate, change the direction of, or otherwise control bending of the PZT when it is actuated. The counterintuitive result is that even though the PZT has an stiff layer added to it that, at least nominally, restrains the expansion and contraction of the PZT, the effective linear stroke distance achieved actually increases. A PZT having a restraining layer according to the invention can be used as a microactuator in a hard disk drive suspension, although it could be used in other applications as well.

In a preferred embodiment the effect of the restraining layer is to actually change the direction of bending. Thus, for a PZT that is bonded on its bottom surface to the suspension, the presence of the restraining layer has the effect that when the piezoelectric element is actuated by a voltage that causes the piezoelectric element to expand, the piezoelectric element bends in a direction that causes the top face to become net concave in shape; and when the piezoelectric element is actuated by a voltage that causes the piezoelectric element to contract, the piezoelectric element bends in a direction that causes the top face to become net convex in shape. The effect is therefore to actually increase the effective linear expansion in expansion mode, and to increase the effective linear contraction in contraction mode. The presence of the restraining layer therefore actually increases the effective stroke length.

The PZT with its constraining layer can be manufactured by various techniques including laminating the constraining layer to an existing PZT element, or one of the PZT element and the constraining layer can be formed on top of the other by an additive process. Such an additive process can include depositing a thin film PZT onto a substrate such as stainless steel (SST). The constraining layer can be stainless steel, silicon, ceramic such as substantially unpoled (unactivated) ceramic material of otherwise the same ceramic material as constitutes the PZT element, or another relatively stiff material. If the restraining layer is non-conductive, one or more electrical vias comprising columns of conductive material can be formed through the restraining layer in order to carry the activating voltage or ground potential from the surface of the microactuator to the PZT element inside.

The constraining layer may be larger (of greater surface area) than the PZT element, the same size as the PZT element, or may be smaller (of lesser surface area) than the PZT element. In a preferred embodiment, the constraining layer is smaller than the PZT element, giving the microactuator a step-like structure with the shelf of the step uncovered by the restraining layer, and with the shelf being where the electrical connection is made to the PZT element. One benefit of such a construction including a shelf where the electrical connection is made is that the completed assembly including the electrical connection has a lower profile than if the restraining layer covers the entire PZT. A lower profile is advantageous because it means that more hard drive platters and their suspensions can be stacked together within a given platter stack height, thus increasing the data storage capacity within a given volume of disk drive assembly.

Simulations have shown that microactuators constructed according to the invention exhibit enhanced stroke sensitivity, and also exhibited reduced sway mode gain and torsion mode gain. These are advantageous in increasing head positioning control loop bandwidth, which translates into both lower data seek times and lower susceptibility to vibrations.

An additional advantage of adding a constraining layer(s) or element(s) to the PZT according to the invention is that in hard disk drives today, the suspension and its components including the PZT are usually very thin. Microactuators used in today's DSA suspension designs in which the PZTs are mounted at the mount plate, are on the order of 150 μm thick. In gimbal-mounted DSA suspension designs the PZTs are even thinner, often being less than 100 μm thick. The PZT material is therefore very thin and brittle, and can crack easily during both manufacturing/assembly, including both the process of manufacturing the PZT microactuator motor itself as well as the automated pick-and-place operation in the suspension assembly process. It is expected that PZTs in future generation hard drives will be 75 μm thick or thinner, which will exacerbate the problem. It is anticipated that PZTs this thin will not only be susceptible to damage during manufacturing/assembly, but could also be vulnerable to cracking or breaking when the disk drive experiences shock, i.e., g-forces. The additional stiff, resilient constraining layer according to the present invention provides additional strength and resiliency to the PZT thus helping to prevent the PZT from cracking or otherwise mechanically failing during manufacturing/assembly and during shock events.

Exemplary embodiments of the invention will be further described below with reference to the drawings, in which like numbers refer to like parts. The drawing figures might not be to scale, and certain components may be shown in generalized or schematic form and identified by commercial designations in the interest of clarity and conciseness.

DETAILED DESCRIPTION OF THE PREFERRED EMBODIMENTS

Figure 7:
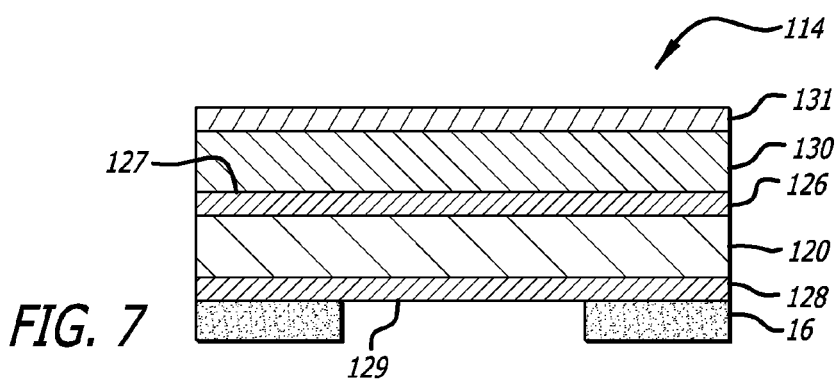
FIG. 7 is a side sectional view of a PZT having a constraining layer bonded thereto in accordance with the present invention.

FIG. 7 is a side sectional view of a PZT microactuator assembly 114 having a constraining layer 130 bonded thereto in accordance with an embodiment of present invention. In keeping with the orientation shown in the figure, the side of the PZT which is bonded to the suspension will be referred to as the bottom side 129 of PZT 114, and the side of the PZT away from the side at which the PZT is bonded to the suspension will be referred to as the top side 127. According to the invention, one or more constraining layers or constraining elements 130 is bonded to the top side 127 of microactuator PZT element 120. The constraining layer 130 preferably comprises a stiff and resilient material such as stainless steel and is preferably bonded directly to the top surface 127 of the PZT element 120 including its top electrode 126, or the SST material may itself serve as the top electrode thus making it unnecessary to separately metalize the top surface. The constraining layer 130 is stiff enough so as to significantly reduce, eliminate, or even reverse the bending of the PZT when actuated. The SST layer 130 preferably has a layer 131 of gold or other contact metal in order to ensure a good electrical connection to the SST.

Alternatively, instead of the constraining layer 130 being stainless steel, it could be ceramic such as an unactivated (unpolarized) layer of the same ceramic material as forms the piezoelectric layer 120, and could be integrated into the assembly by either bonding or by deposition. The ceramic material is unpolarized meaning that it exhibits substantially less piezoelectric behavior, such as less than 10% as much piezoelectric behavior, as the poled ceramic that defines piezoelectric layer 120. Such an assembly, defining a stack consisting from the bottom up of electrode/poled PZT/electrode/unpoled PZT, may be easier to manufacture than a stack of electrode/PZT/electrode/SST.

In the discussion that follows, for simplicity of discussion top and bottom electrodes 126, 128 are sometimes omitted from the figures and from the discussion, it being understood that PZT microactuators will almost always have at least some type of top and bottom electrode.

A layer of copper or nickel may be deposited onto the SST layer 130 before gold layer 131 is applied in order to increase the adhesion of the gold to the SST, as discussed in U.S. Pat. No. 8,395,866 issued to Schreiber et al. which is owned by the assignee of the present application, and which is hereby incorporated by reference for its teaching of electrodepositing other metals onto stainless steel. Similarly, the electrodes 126,128 may comprise a combination of nickel and/or chromium, and gold (NiCr/Au).

Figure 5:
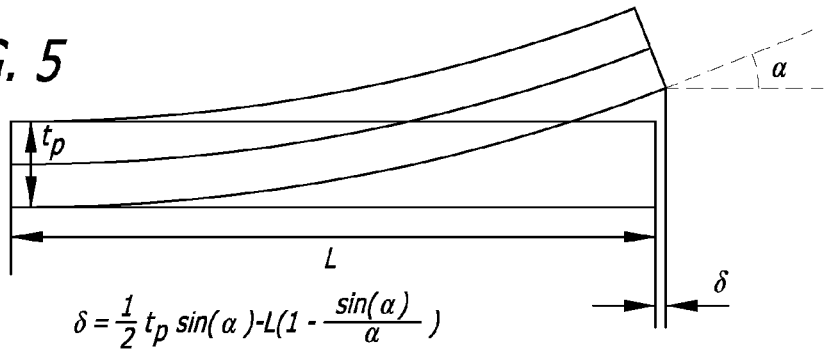
FIG. 5 is a diagram and an associated equation for the amount of linear stroke added or lost due to bending of a PZT.
Figure 6:
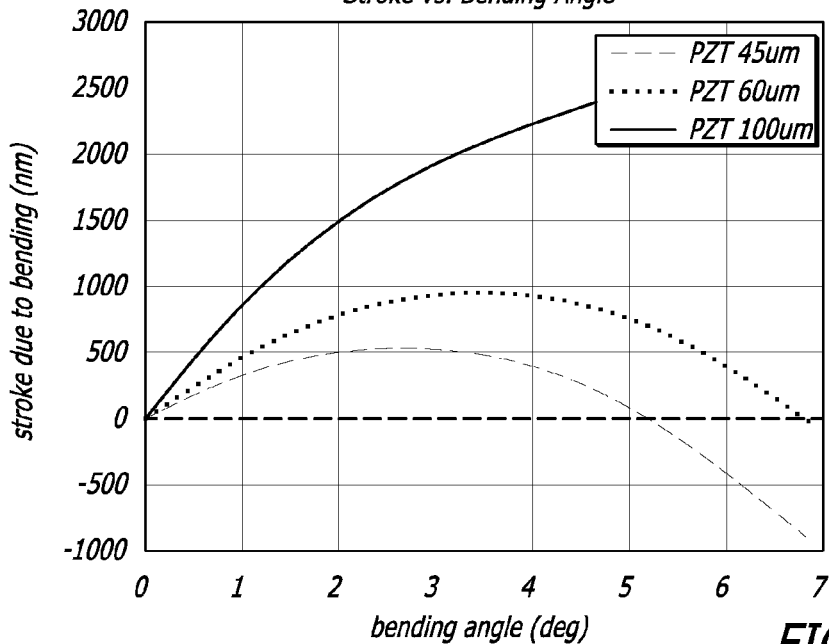
FIG. 6 is a plot of stroke loss due to bending verses bending angle for three different thicknesses of PZTs.

124-167 (FIG. 5). In one illustrative embodiment according to a simulation, the thicknesses of the various layers were:

130 PZT 3 μm 126, 128, 131 NiCr/Au 0.5 μm

The thin film PZT had a length of 1.20 mm, the PZT bonding had a width of 0.15 min at both ends, and the piezoelectric coefficient d31 was 250 pm/V. In some embodiments, the SST layer may be at least 12 micrometers thick in order to provide adequate support.

In the above example the DSA suspension exhibited a stroke sensitivity of 26.1 nm/V according to a simulation. In contrast, a 45 μm thick bulk PZT (d31=320 pm/V) with the same geometry would typically exhibit a stroke sensitivity of only 7.2 nm/V.

The ratio of thicknesses of the SST layer to the PZT layer may be as high as 1:1, or even 1.25:1 or even higher. As the thickness ratio of the constraint layer to the PZT reaches approximately 1:25, the stroke sensitivity improvement due to the constraint layer may start to be negative, indicating the thickness limitation of the PZT constraint layer.

Figure 8A:
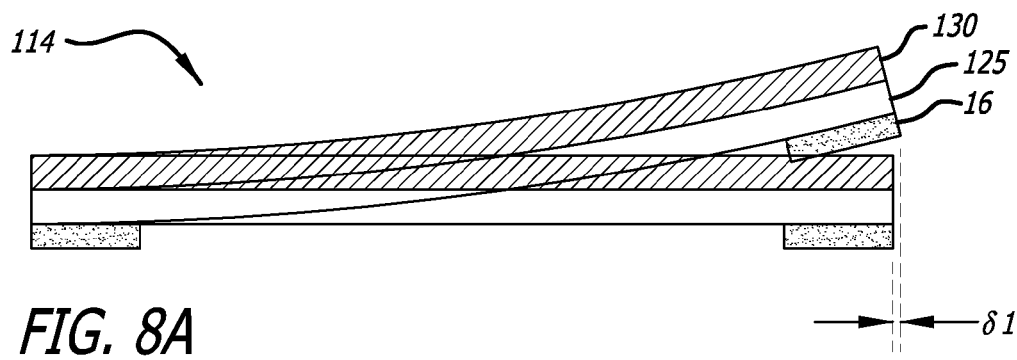
FIG. 8A is a side sectional view of the PZT microactuator of FIG. 8 when a voltage is applied to the PZT so as to expand it.

FIG. 8A is a side sectional view of a PZT microactuator 114 of FIG. 7 when a voltage is applied to the PZT so as to expand it. The PZT stroke consists of two vectors, one that is the pure extension stroke δe, the other is the extension contribution δ1 due to the constraining layer causing the PZT's right tip to bend upward, instead of bending downward as would be the case without the restraining layer. The total stroke length is δe+δ1. In expansion mode therefore, the PZT assumes a slightly concave shape when viewed from the top, i.e. the PZT top surface assumes a slightly concave shape, which is in a bending direction that is the opposite from the bending of the prior art PZT of FIG. 4. That bending according to the invention therefore adds to the effective stroke length rather than subtracting from it.

Figure 8B:
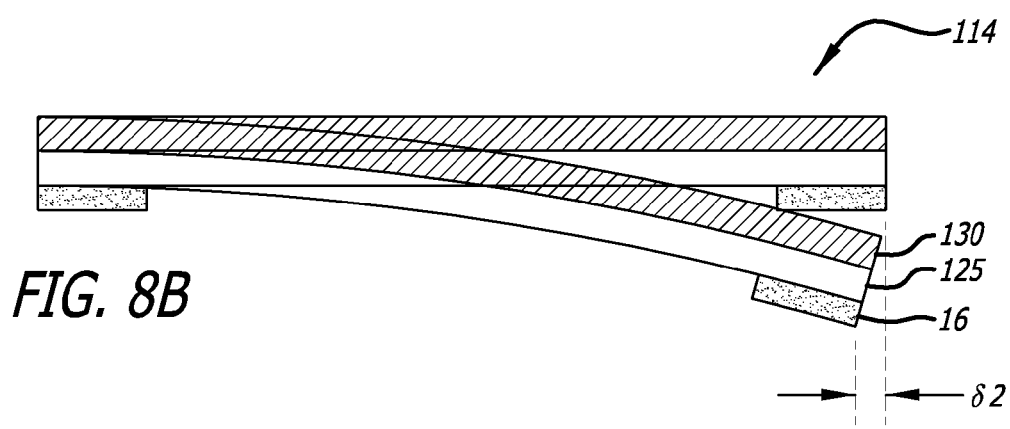
FIG. 8B is a side sectional view of a PZT microactuator of FIG. 8 when a voltage is applied to the PZT so as to contract it.

FIG. 8B is a side sectional view of a PZT microactuator of FIG. 7 when a voltage is applied to the PZT 114 so as to contract it. The PZT stroke consists of two vectors, one that is the pure contraction stroke −|δc|, the other is the contraction contribution δ2 due to the constraining layer causing the PZT's right tip to bend downward, instead of bending upward as would be the case without the restraining layer. The total stroke length is [δc+δ2]. In contraction mode therefore, the PZT assumes a slightly convex shape when viewed from the top, i.e. the PZT top surface assumes a slightly convex shape, which is in a bending direction that is the opposite from the bending of the prior art PZT of FIG. 4. That bending according to the invention therefore adds to the effective stroke length rather than subtracting from it.

Figure 1:
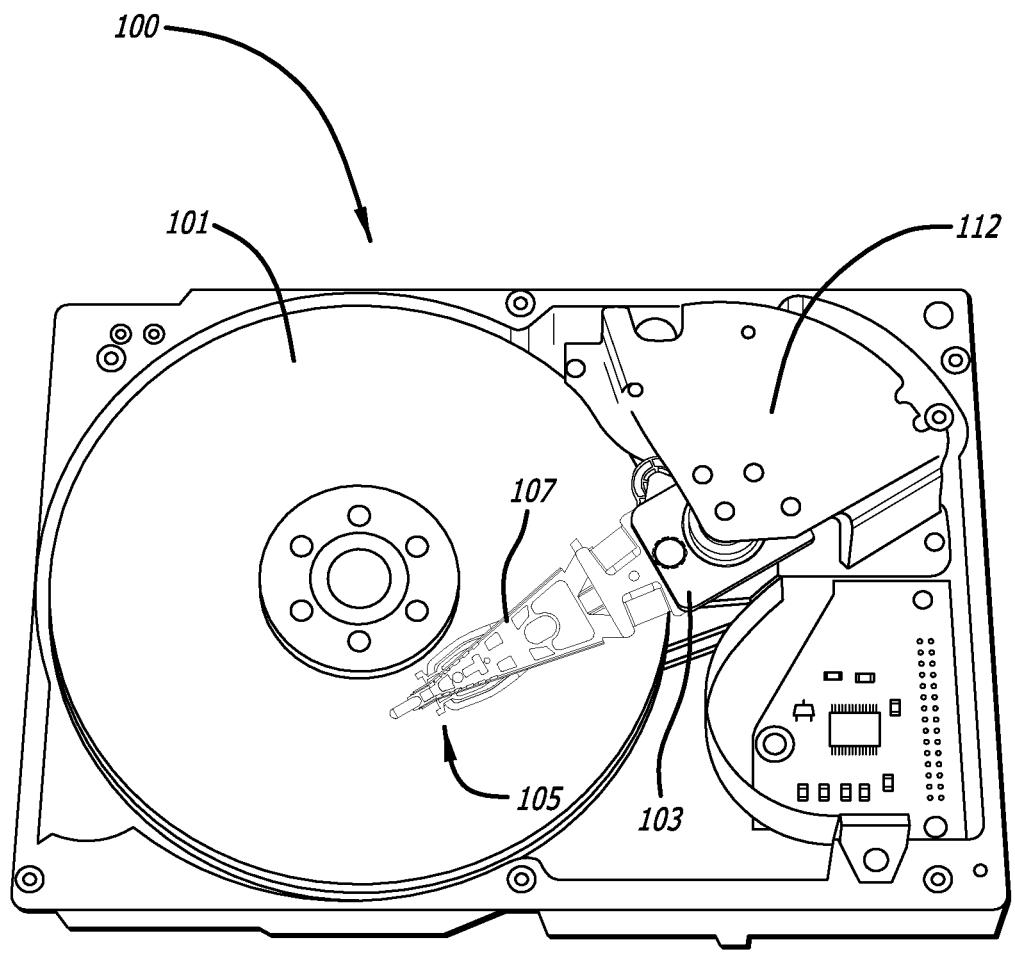
FIG. 1 is a top perspective view of a prior art magnetic hard disk drive.
Figure 2:
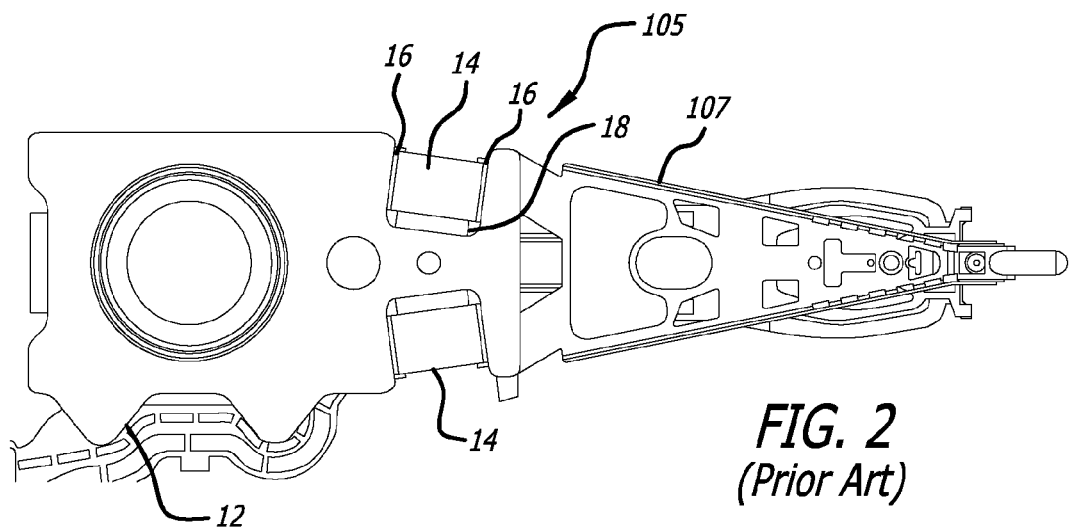
FIG. 2 is a top plan view of the suspension of the disk drive of FIG. 1.
Figure 3:
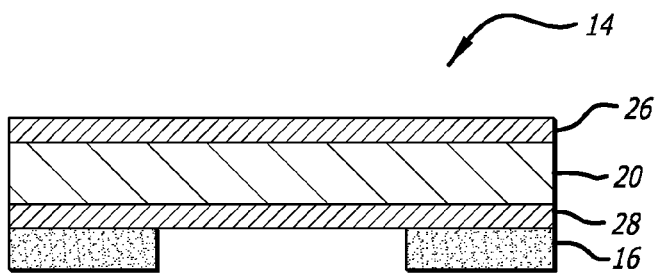
FIG. 3 is a side sectional view of the prior art PZT microactuator and mounting of FIG. 2.
Figure 4A:
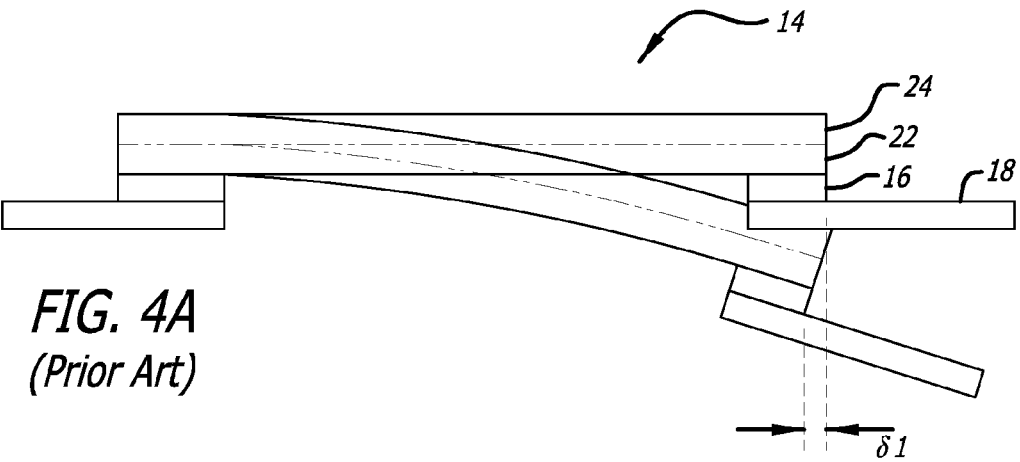
FIG. 4A is a side sectional view of a PZT microactuator mounted in a suspension according to prior art FIG. 2 when a voltage is applied to the PZT so as to expand it.
Figure 4B:
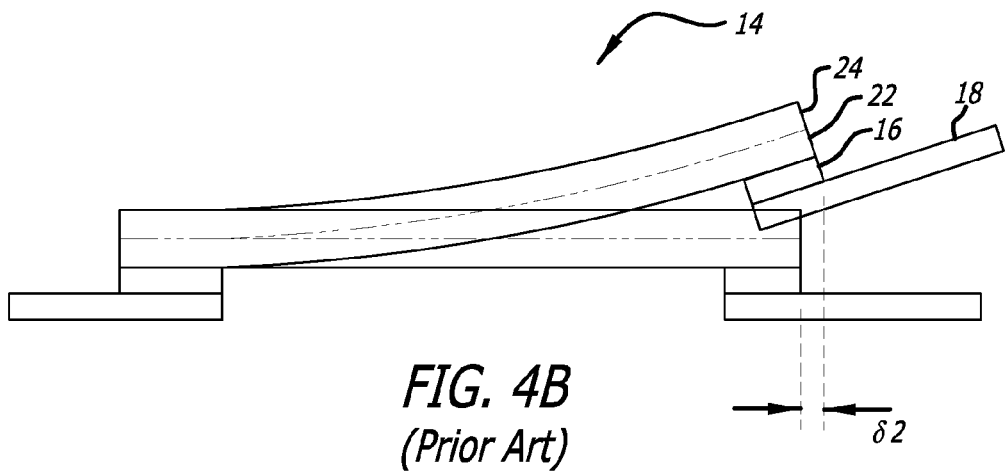
FIG. 4B is a side sectional view of a PZT microactuator mounted in a suspension according to prior art FIG. 2 when a voltage is applied to the PZT so as to contract it.

Adding the constraining layer 130 to a PZT microactuator 114 has no appreciate affect on the stroke length for the otherwise unrestrained and unbonded PZT 114. When that PZT 114 is bonded to a suspension 18 at its bottom ends such as shown in FIG. 4, however, the effect of the constraining layer is actually to slightly increase the stroke length. Stainless steel has a Young's modulus of around 190-210 GPa. Preferably the material for the constraining layer has a Young's modulus of greater than 50 GPa, and more preferably greater than 100 GPa, and more preferably still greater than 150 GPa.

Figure 9:
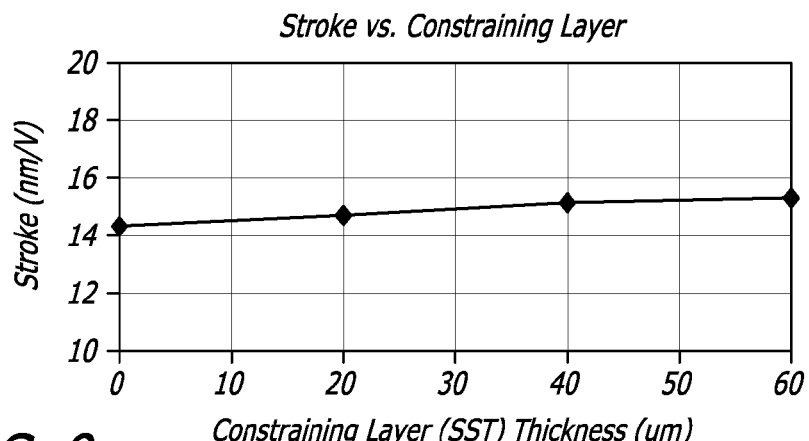
FIG. 9 is a graph showing stroke length per unit input voltage in units of nm/V verses constraining layer thickness, for a PZT that is 130 μm thick.

FIG. 9 is a graph of stroke length per unit input voltage in units of nm/V verses constraining layer thickness, for a PZT 114 that is 130 μm thick and has a constraining layer 130 of stainless steel bonded thereto, according to a simulation. Adding an SST restraining layer of 20 μm, 40 μm, and 60 μm thick onto the PZT top surface each result in an increased total stroke length. Adding a constraining layer therefore actually increased the total stroke length.

Figure 10:
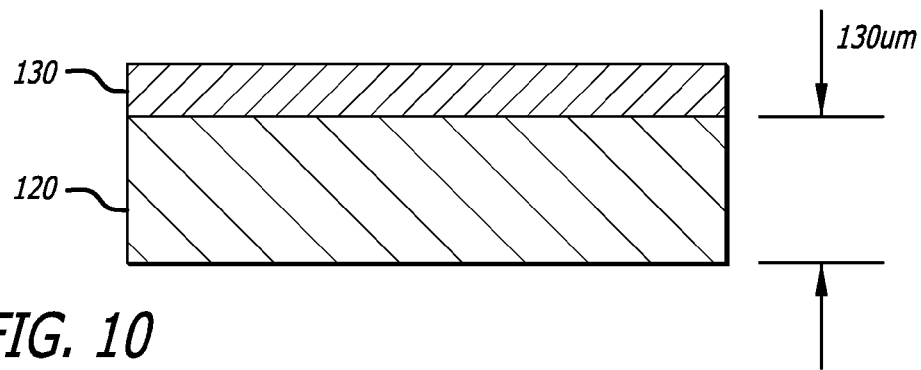
FIG. 10 is a side elevation view of a PZT having a constraining layer bonded thereto according to the invention.
Figure 11:
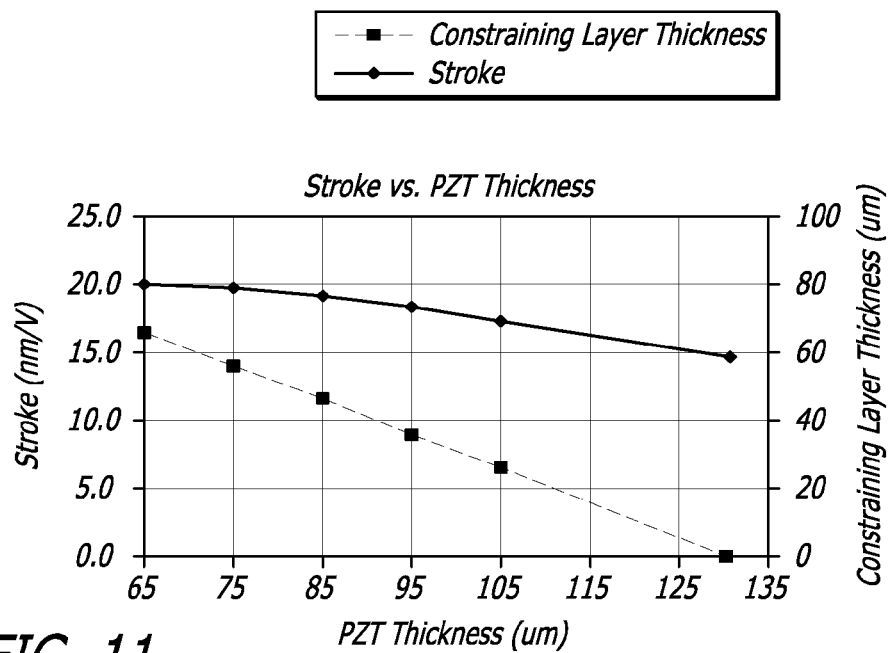
FIG. 11 is a graph of stroke length vs. PZT thickness for the PZT of FIG. 10 where the combined thickness of the PZT and the restraining layer is kept constant at 130 μm.

One could also hold constant the total combined thickness of the PZT and the constraining layer, and determine an optimal thickness for the constraining layer. FIG. 10 is a side elevation view of a combined PZT and constraining layer bonded thereto according to the invention, in which the total thickness is kept constant at 130 μm. FIG. 11 is a graph of stroke length vs. PZT thickness for the PZT of FIG. 10 where the combined thickness of the PZT and the restraining layer is kept constant at 130 μm according to a simulation. With no constraining layer, the 130 μm thick PZT has a stroke length of approximately 14.5 nm/V. With a constraining layer 130 thickness of 65 μm and a PZT thickness of 65 μm, the PZT has a stroke length of approximately 20 nm/V. Adding the constraining layer therefore actually increased the effective stroke length by approximately 35%.

Figure 12:
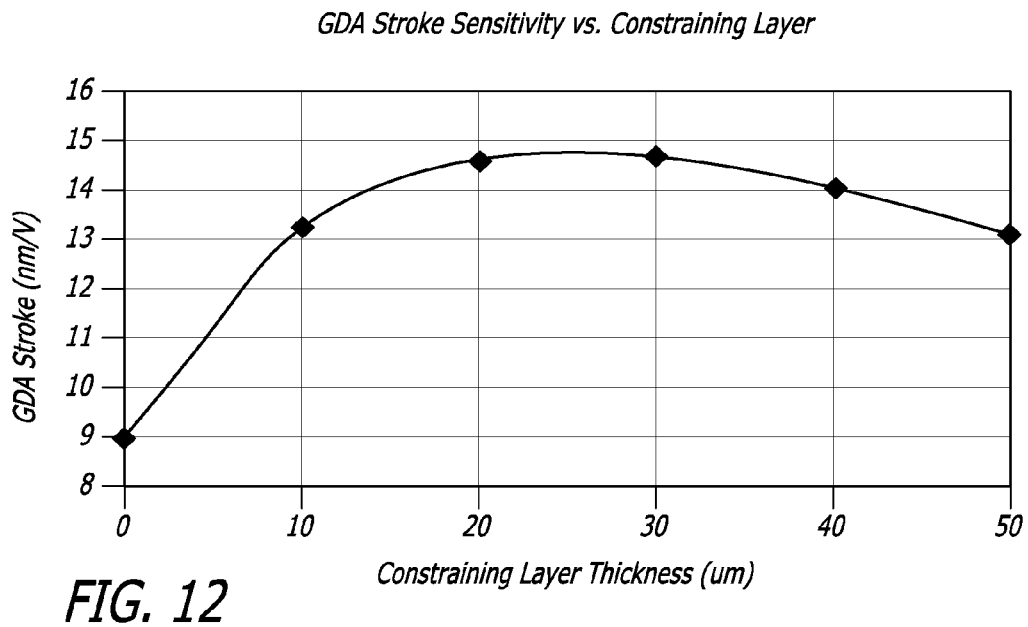
FIG. 12 is a graph of GDA stroke sensitivity versus constraining layer thickness for a suspension having a PZT with stainless steel constraining layers of varying thicknesses.

FIG. 12 is a graph of GDA stroke sensitivity versus constraining layer thickness for a GDA suspension having the microactuator of FIG. 7 for a PZT element that is 45 μm thick and a stainless steel constraining layer on top of varying thicknesses, according to a simulation. As seen in the graph, a constraining layer that is 30 μm thick increased the GDA stroke sensitivity from 9 nm/V to slightly more than 14.5 μm, which represents an increase in stroke length of greater than 50%.

Figure 13A:
FIGS. 13(a)-13(h) illustrate one manufacturing process by which a PZT having a constraining layer according to the invention can be produced.
Figure 13B:
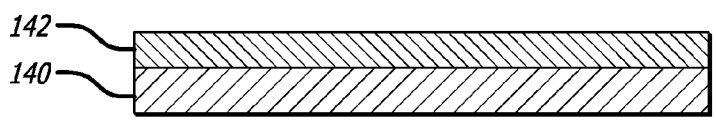
Figure 13C:
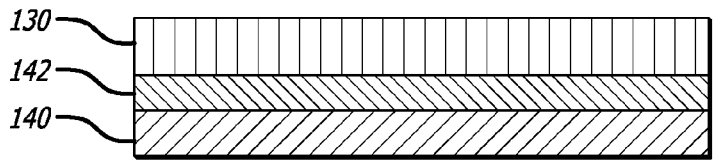
Figure 13D:
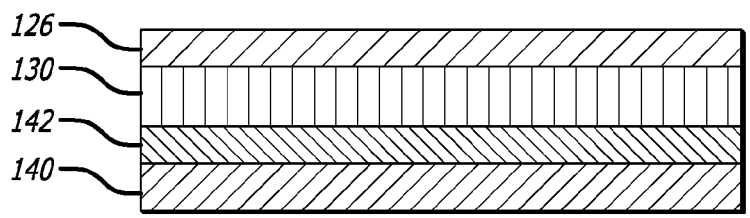
Figure 13E:
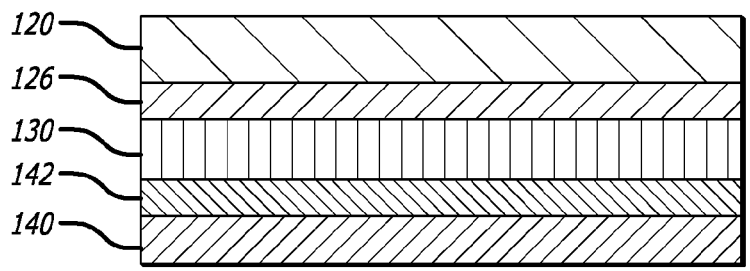
Figure 13F:
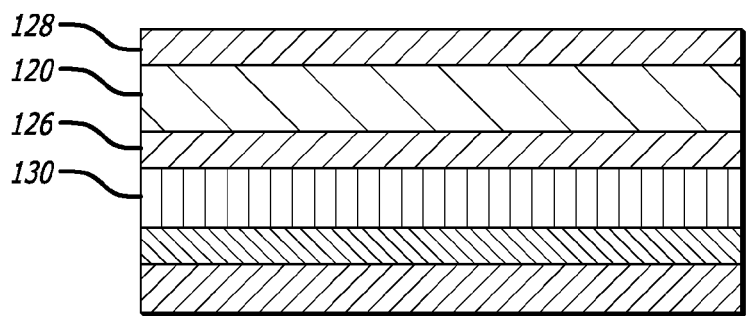
Figure 13G:
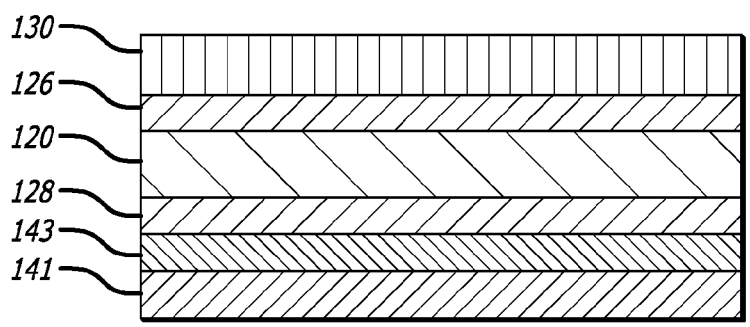
Figure 13H:
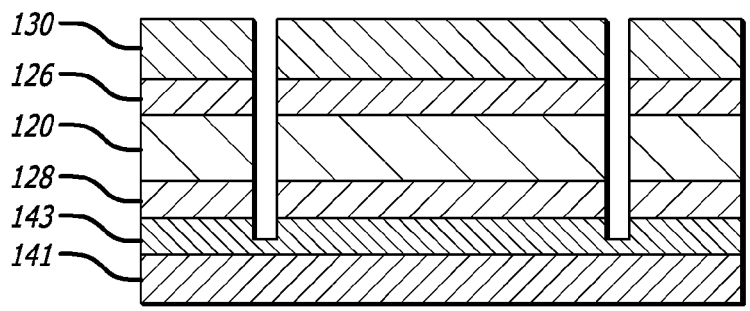

FIGS. 13(a)-13(h) illustrate one manufacturing process by which a PZT microactuator assembly having a constraining layer according to the invention can be produced. This method is an example of an additive method in which the PZT material is deposited onto a substrate that will be the constraint layer. The process begins with a first substrate 140 as shown in FIG. 13(a). In FIG. 13(b) a first UV/thermal tape 142 is applied to the substrate. In FIG. 13(c) a pre-formed SST layer 130 is added onto the tape. In FIG. 13(d) an electrode layer 126 is deposited onto the SST such as by sputtering or other well known deposition processes. In FIG. 13(e) a PZT layer 120 is formed on the electrode layer by the sol-gel method or other known methods. In FIG. 13(f) a second electrode 128 is deposited onto the exposed side of the PZT such as by sputtering. In FIG. 13(g) the SST layer 130 is separated from the tape, and the product is flipped over onto a second tape 143 and a second substrate 141. In FIG. 13(h) the product is then diced such as by mechanical sawing or laser cutting in order to singulate the individual microactuators 114. This process produces a microactuator 114 in which the PZT element 120 including its electrodes is bonded directly to the SST restraining layer 130 without any other material, such as an organic material such as polyimide that would render the restraining effect of the restraining layer less effective, therebetween. The electrode layers may be of materials such as Au, Ni, Cr, and/or Cu. Au has a Young's modulus of about 79 GPA, Cu has a Young's modulus of about 117 GPa, Ni has a Young's modulus of about 200, and Cr has a Young's modulus of about 278. Preferably, there is no intermediary layer between the SST restraining layer 130 and the PZT element 120 that has a Young's modulus that is less than 20 GPa, or which has a Young's modulus that is substantially less than the Young's modulus of the restraining layer, or a Young's modulus that is less than half the Young's modulus of the restraining layer.

Although other methods could be used to produce the product such as by bonding the restraining layer directly to the PZT surface by adhesive such as epoxy, the method shown in FIGS. 13(a)-13(g) is currently anticipated to be the preferred method.

The SST restraining layer 130 acts as a substrate for the PZT layer 120 both during the additive manufacturing process as well as in the finished product. The restraining layer 130 is therefore sometimes referred to as a substrate.

Figure 14A:
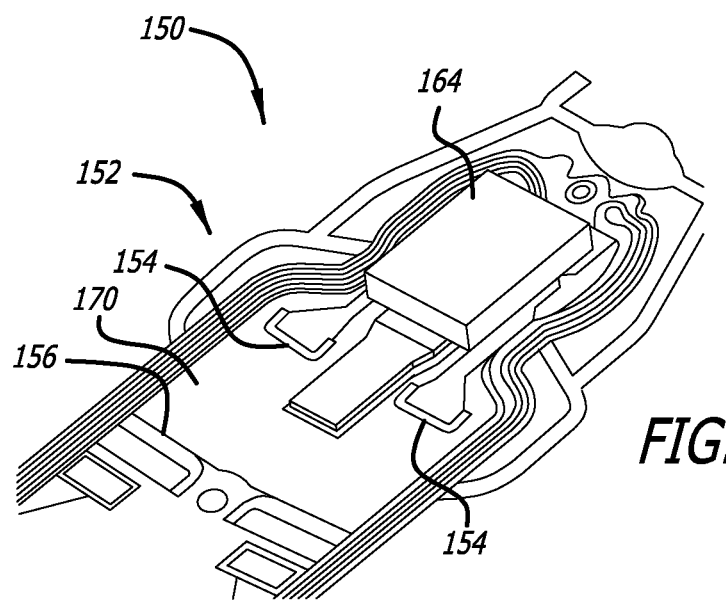
FIGS. 14(a) and 14(b) are oblique views of a GSA suspension being assembled with thin film PZT microactuator motors according to the invention.
Figure 14B:
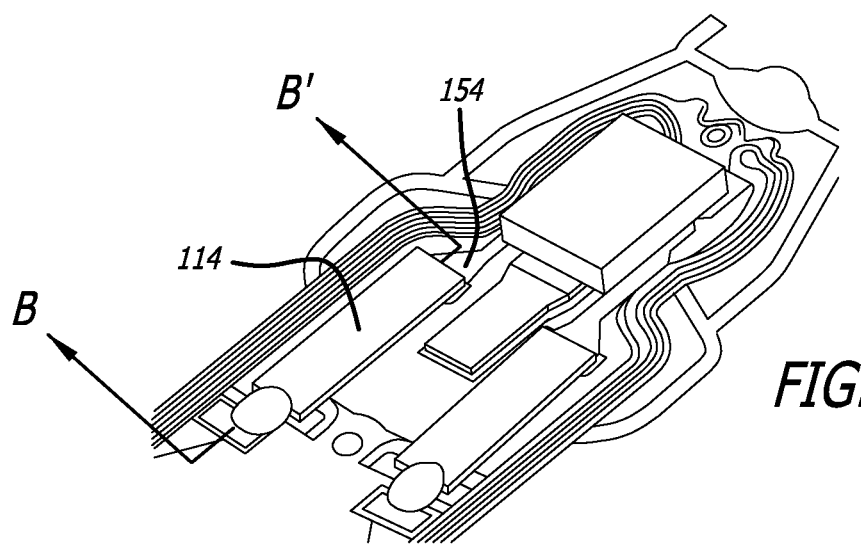

FIGS. 14(a) and 14(b) are oblique views of a gimbal mounted dual stage actuated (GSA) suspension 150 being assembled with thin film PZT microactuator motors 114 according to the invention. In a GSA suspension the PZTs are mounted on the trace gimbal which includes a gimbal assembly, and act directly on the gimbaled area of the suspension that holds the read/write head slider 164. FIG. 14(a) shows the suspension 150 before PZT microactuator assemblies 114 are attached. Each of two microactuators 114 will be bonded to, and will span the gap 170 between, tongue 154 to which the distal end of microactuator 114 will be bonded, and portion 156 of the trace gimbal to which a proximal end of microactuator 114 will be bonded. FIG. 14(b) shows the suspension 150 after PZT microactuators 114 are attached. When microactuator assembly 114 is activated, it expands or contracts and thus changes the length of the gap 170 between the tongue 154 and portion 156 of the trace gimbal, thus effecting fine positioning movements of head slider 164 which carries the read/write transducer.

Figure 15:
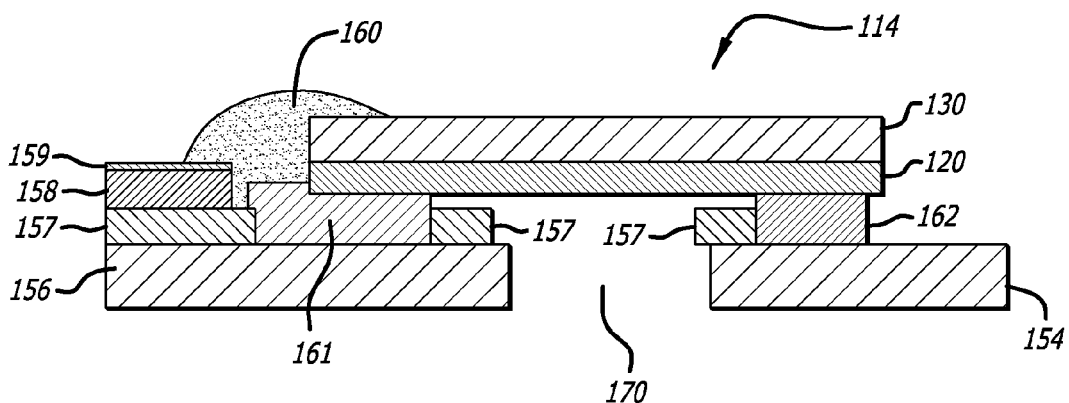
FIG. 15 is cross-sectional view of the microactuator area of FIG. 14(b) taken along section line B-B".

FIG. 15 is cross-sectional view of FIG. 14(b) taken along section line B-B". GSA suspension 150 includes a trace gimbal 152, which includes layers of stainless steel, an insulator 157 such as polyimide, and a layer of signal conducting traces 158 such as Cu covered by a protective metal 159 such as Au or a combination of Ni/Au. Microactuators 114 are attached at their distal ends to stainless steel tongues 154 extending from the gimbal area by conductive adhesive 162 such as epoxy containing Ag particles to make it electrically conductive, and at their proximal ends to a mounting area 156 of the stainless steel by non-conductive adhesive 161 such as non-conductive epoxy. The driving voltage electrical connection is made by a spot of conductive adhesive 160 that extends from the gold plated copper contact pad 158 to the top surface of PZT microactuator 114, and more particularly in this case to the SST layer 130 which constitutes the top electrode of the microactuator.

Figure 16:
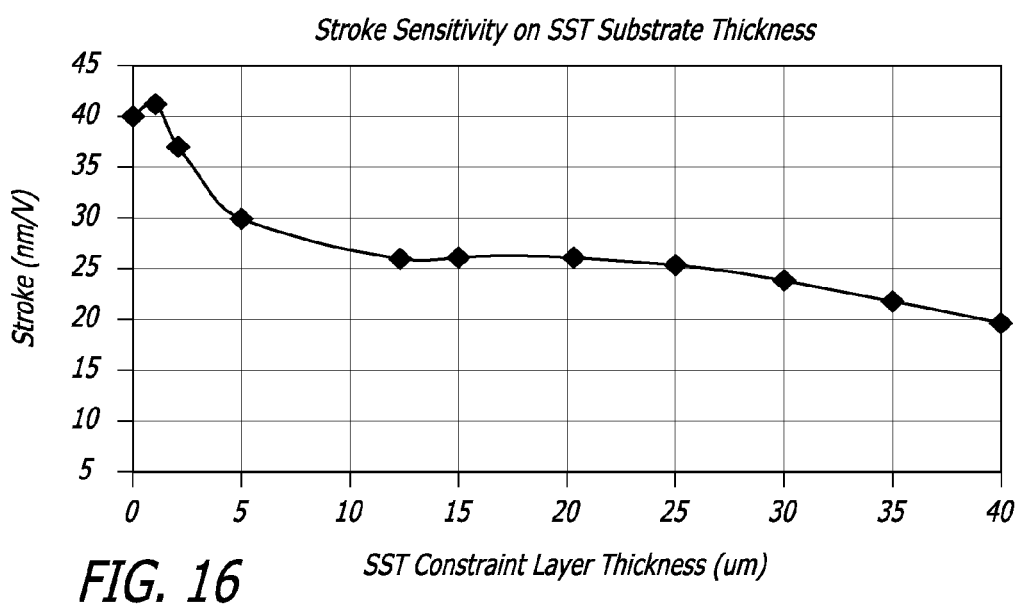
FIG. 16 is a graph of stroke sensitivity versus SST substrate thickness for the microactuator of FIG. 15 according to a simulation.

The SST substrate thickness may be varied to some degree without compromising the benefits of the disclosed thin film PZT structure. FIG. 16 is a graph of stroke sensitivity versus SST constraining layer thickness for the microactuator of FIG. 15 according to a simulation. A thin film PZT having a 40 μm thick SST constraining layer exhibited a stroke sensitivity of 20 nm/V according to a simulation, which is almost 3 times the stroke sensitivity of the aforementioned 45 μm thick bulk PZT. A 45 μm thick SST constraining layer, however, would provide better protection to the thin film PZT microactuator.

Figure 17A:
FIGS. 17(a)-17(f) illustrates a process for manufacturing a thin film PZT structure having a stainless steel substrate according to the invention.
Figure 17B:
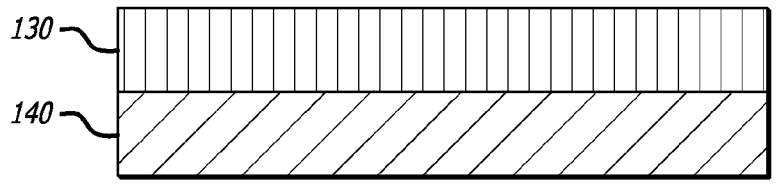
Figure 17C:
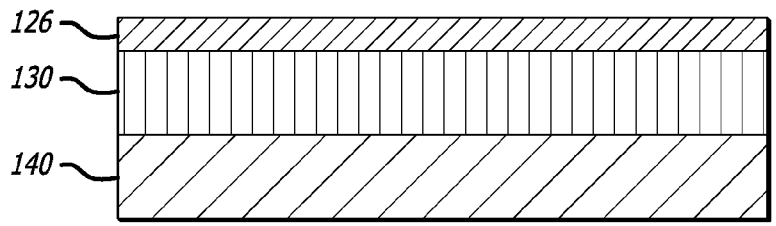
Figure 17D:
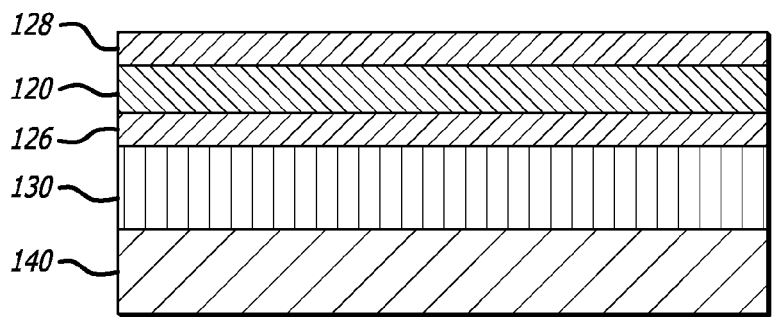
Figure 17E:
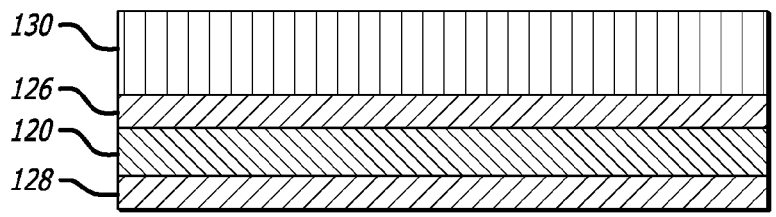
Figure 17F:
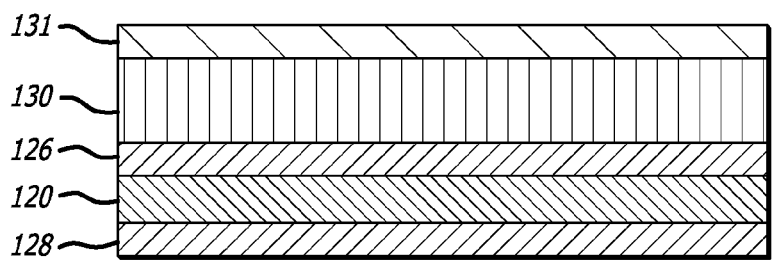

FIGS. 17(a)-17(f) illustrates an alternative process for manufacturing a thin film PZT structure having an SST constraining layer according to the invention. In FIG. 17(a) the process begins with a silicon substrate 144 instead of a substrate 140 and tape 142 as in FIG. 18(b). In FIG. 17(b) an SST layer (130) is bonded to the silicon. The process otherwise proceeds in essentially the same way as the process of FIGS. 13(c)-13(h), including the flipping of the assembly over and removal of the silicon substrate in FIG. 17(e). Additionally, these figures explicitly show the addition of final NiCr/Au layer 131, which was not explicitly shown in FIG. 13(e).

Figure 18:
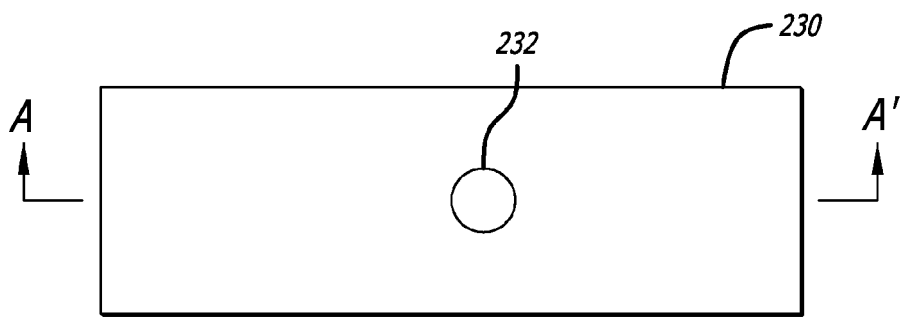
FIG. 18 is a top plan view of a thin film PZT structure having a silicon substrate according to the invention.
Figure 19:
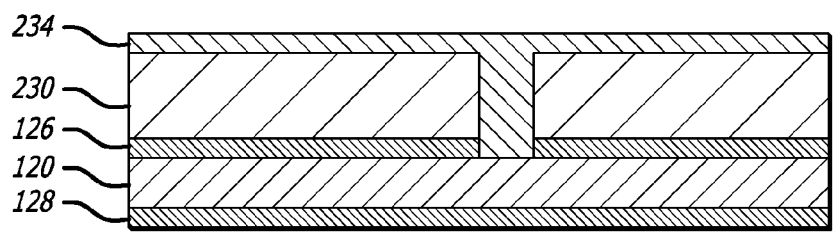
FIG. 19 is a side sectional view of the thin film PZT structure of FIG. 18 taken along section line A-A'.

As mentioned above, different types of constraint layers may be used in different implementations. Other rigid materials, either conductive or non-conductive, can also be used as the constraint layer or substrate. Silicon, for example, could be used as the constraint layer material. FIG. 18 is a top plan view of a thin film PZT structure having a silicon constraint layer according to an embodiment of the invention. FIG. 19 a cross sectional view of the microactuator of FIG. 18 taken along section line A-A'. Because the silicon constraint layer 230 is non-conductive, a via 232 is provided in order to conduct the PZT driving voltage from a conductive top layer 234 such as Au over silicon 230 through to the metalized electrode 126 on the PZT element 120. The via may be formed and filled with conductive metal as disclosed in U.S. Pat. No. 7,781,679 issued to Schreiber et al. which is owned by the assignee of the present invention and which is incorporated herein by reference for its teachings of conductive vias and methods of forming conductive vias.

Figure 20:
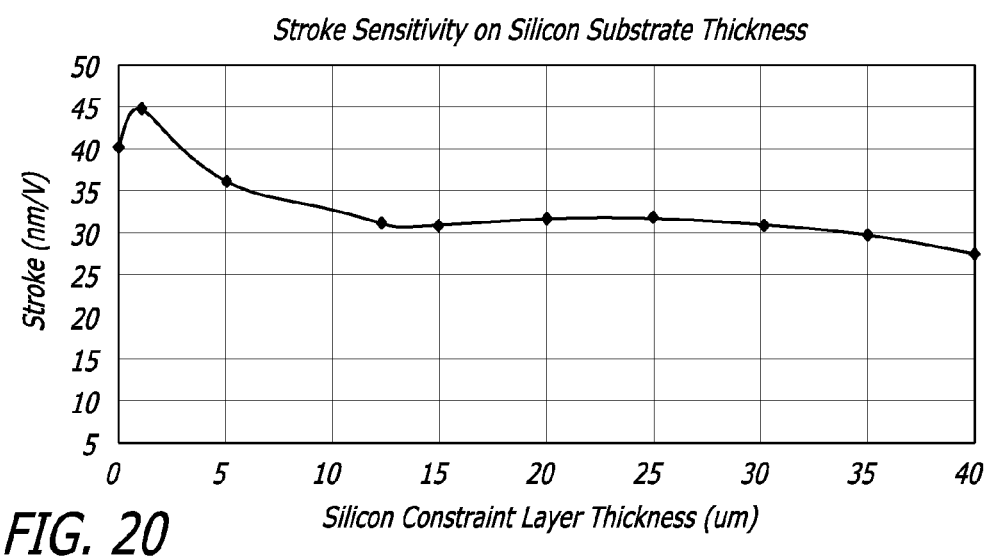
FIG. 20 is a graph of stroke sensitivity versus silicon substrate thickness for the microactuator of FIG. 19 according to a simulation.

FIG. 20 is a graph of stroke sensitivity versus silicon substrate thickness for the microactuator of FIG. 19 according to a simulation. As shown in the graph, a thin film PZT having a thickness of 3 μm and a 20 μm thick silicon substrate may exhibit a stroke sensitivity of 31.5 nm/V. This is more than 4 times as high as the stroke sensitivity of a design with a 45 μm thick bulk PZT. The silicon substrate also helps to improve the reliability of the thin film PZT.

Figure 21A:
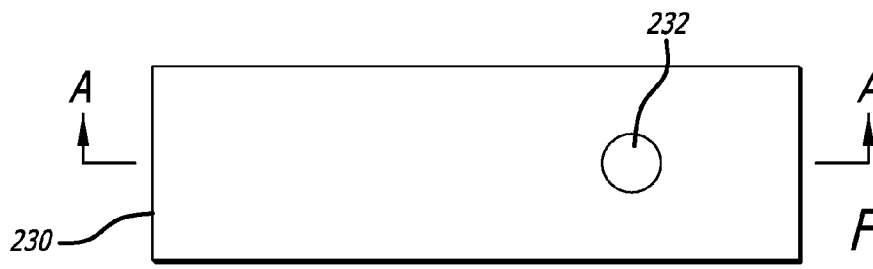
FIGS. 21(a)-21(e) illustrate a process for manufacturing the thin film PZT structure of FIG. 18.
Figure 21B:
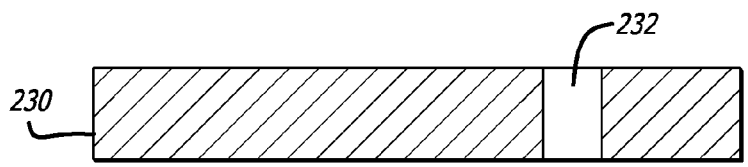
Figure 21C:
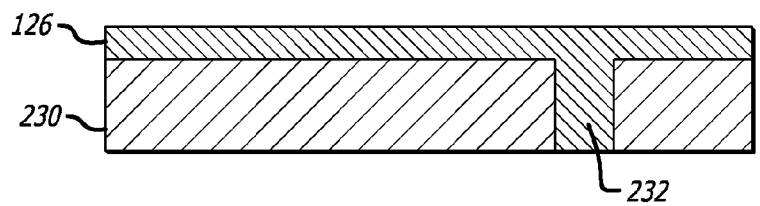
Figure 21D:
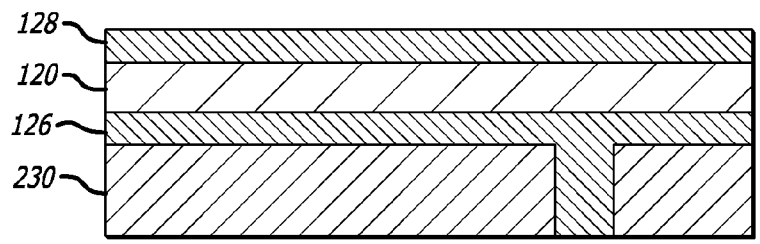
Figure 21E:
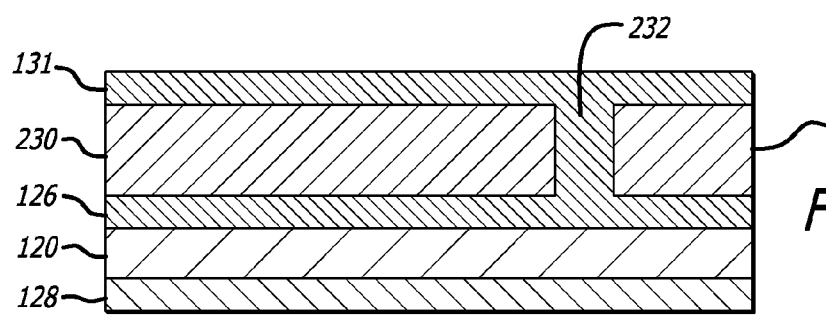

FIGS. 21(a)-21(e) illustrate a process for manufacturing the thin film PZT structure of FIG. 18. The process begins in FIGS. 21(a) and 21(b) with a silicon substrate having a hole or via 232 that has been formed in it such as by laser drilling. In FIG. 21(c) the NiCr/Au layer is added to silicon substrate 230 to form top electrode 126. The NiCr/Au also fills the hole to make it an electrical via 232. More generally, other conductive material may be used to fill the via. In FIG. 22(d) a PZT thin film 120 is deposited such as by the sol-gel method, and another layer of NiCr/Au is added to form the bottom electrode 128. In FIG. 22(e) the material is flipped over, and a final NiCr/Au layer 131 is added. Layers 131 and 126 are electrically connected by via 232 so that a voltage (or ground potential) applied to the conductive gold layer 131 will be transmitted to the PZT element 126. This manufacturing process for a thin film PZT microactuator having a silicon substrate may be less complicated than the manufacturing process for the thin film PZT having an SST substrate.

Figure 22:
FIG. 22 is a top plan view of a thin film PZT having a substrate and having side vias according to an embodiment of the invention.
Figure 23:
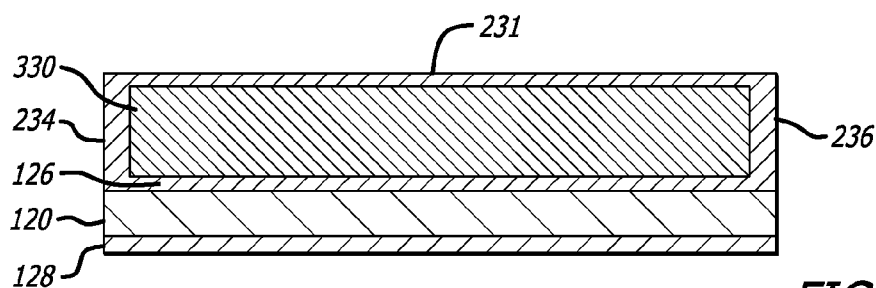
FIG. 23 is a sectional view of the microactuator of FIG. 22 taken along section line A-A".

In an alternative embodiment, the middle via on the silicon substrate can be replaced by one or more vias at the end the silicon. Therefore, after the final dicing, a half-circle will be formed at each end of the silicon. FIG. 22 is a top plan view of a thin film PZT microactuator having a silicon or other non-conductive constraining layer 330 with conductive top layer 231 such as a metallization layer thereon, and having side vias 234, 236 that electrically connect top layer 231 to top electrode 126. FIG. 23 is a sectional view of the PZT of FIG. 22 taken along section line A-A'. The manufacturing process for this embodiment can be otherwise identical with that of FIGS. 21(a)-21(e).

Figure 24:
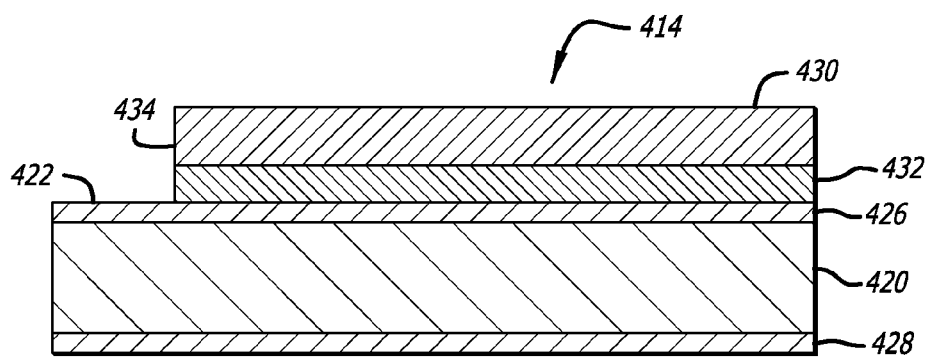
FIG. 24 is a sectional view of a PZT microactuator according to an additional embodiment of the invention.

The constraining layer may be larger (of greater surface area) than the PZT element, the same size as the PZT element, or may be smaller (of lesser surface area) than the PZT element. FIG. 24 is a side sectional view of a PZT microactuator assembly 414 in which the constraint layer 430 is smaller than the PZT element 420, giving the microactuator a step-like structure having a step 434 and an exposed shelf 422 that is uncovered by the restraining layer 430, and with the shelf 422 being where the electrical connection is made to the PZT element 420. One benefit of such a construction including a step where the electrical connection is made is that the completed assembly including the electrical connection has a lower profile than if the restraining layer 430 covers the entire PZT 420. A lower profile is advantageous because it means that more hard drive platters and their suspensions can be stacked together within a given platter stack height, thus increasing the data storage capacity within a given volume of disk drive assembly. It is anticipated that the constraint layer 430 would cover more than 50% but less than 95% of the top surface of PZT element 420 in order to accommodate the electrical connection on shelf 422.

124-182. Simulations have shown that microactuators constructed according to the invention exhibit enhanced stroke sensitivity, and also exhibited reduced sway mode gain and torsion mode gain. These are advantageous in increasing head positioning control loop bandwidth, which translates into both lower data seek times and lower susceptibility to vibrations.

Figure 25:
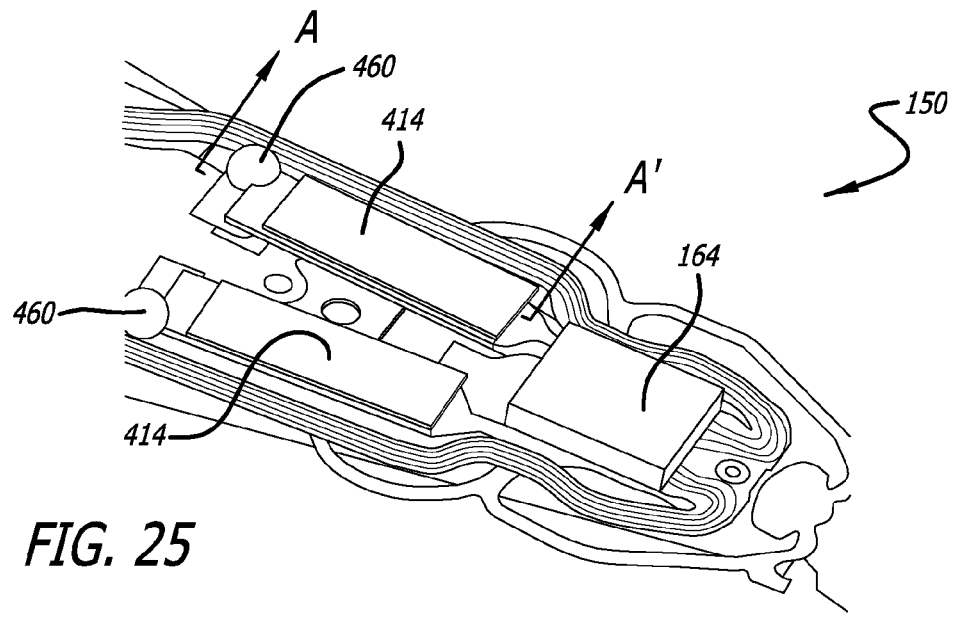
FIG. 25 is an oblique view of a GSA suspension having a pair of the PZT microactuators of FIG. 24.

FIG. 25 is an oblique view of a GSA suspension having a pair of the PZT microactuators 414 of FIG. 24.

Figure 26:
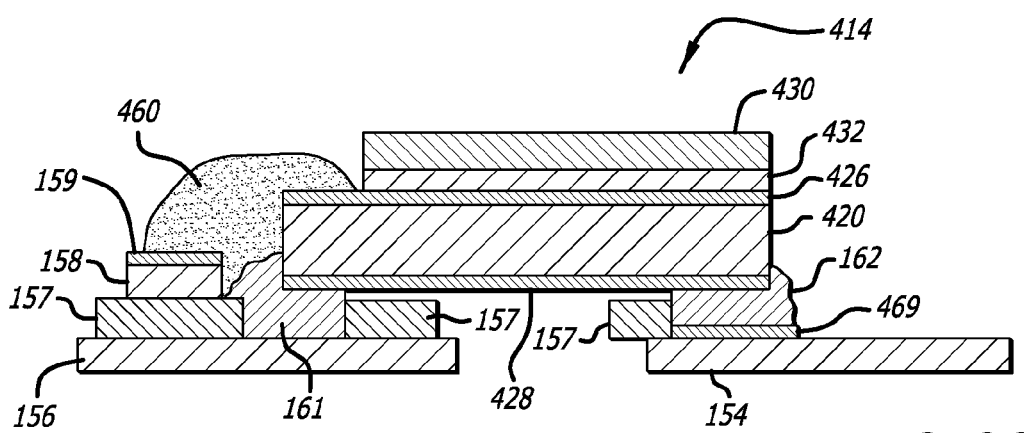
FIG. 26 is a sectional view of the GSA suspension of FIG. 25 taken along section line A-A".

FIG. 26 is a sectional view of the GSA suspension of FIG. 25 taken along section line A-A'. In this embodiment conductive adhesive 460 such as conductive epoxy does not extend over the restraint layer 430. Rather, conductive epoxy 460 extends onto shelf 422 on top of PZT element 420 and establishes electrical connection to the PZT 420 and to the overall microactuator assembly 414 by that surface. As depicted, the electrical connection defined by conductive epoxy 460 has an uppermost extent that is lower than the top surface of the SST restraint layer 430. More generally, regardless of whether the electrical connection is made by conductive adhesive, a wire that is bonded such as by thermosonic bonding, soldering, or other techniques, the electrical connection 461 to the microactuator assembly 414 can be made to be no higher than, or even lower than, the uppermost extent of microactuator 414. This allows the microactuator assembly 414 including its electrical connection to be as thin as possible, which in turn allows for a denser stack of data storage disk platters within the platter stack of a disk drive assembly.

The figure also explicitly shows gold layer 469 over the stainless steel portion 154 of the trace gimbal to which microactuator 414 is mounted. Gold layer 469 provides corrosion resistance and enhanced conductivity to the SST.

In this embodiment as with all of the other embodiments, the restraining layer and more generally the top surface of the PZT microactuator assembly, will normally have nothing bonded to it other than an electrical connection.

Figure 27:
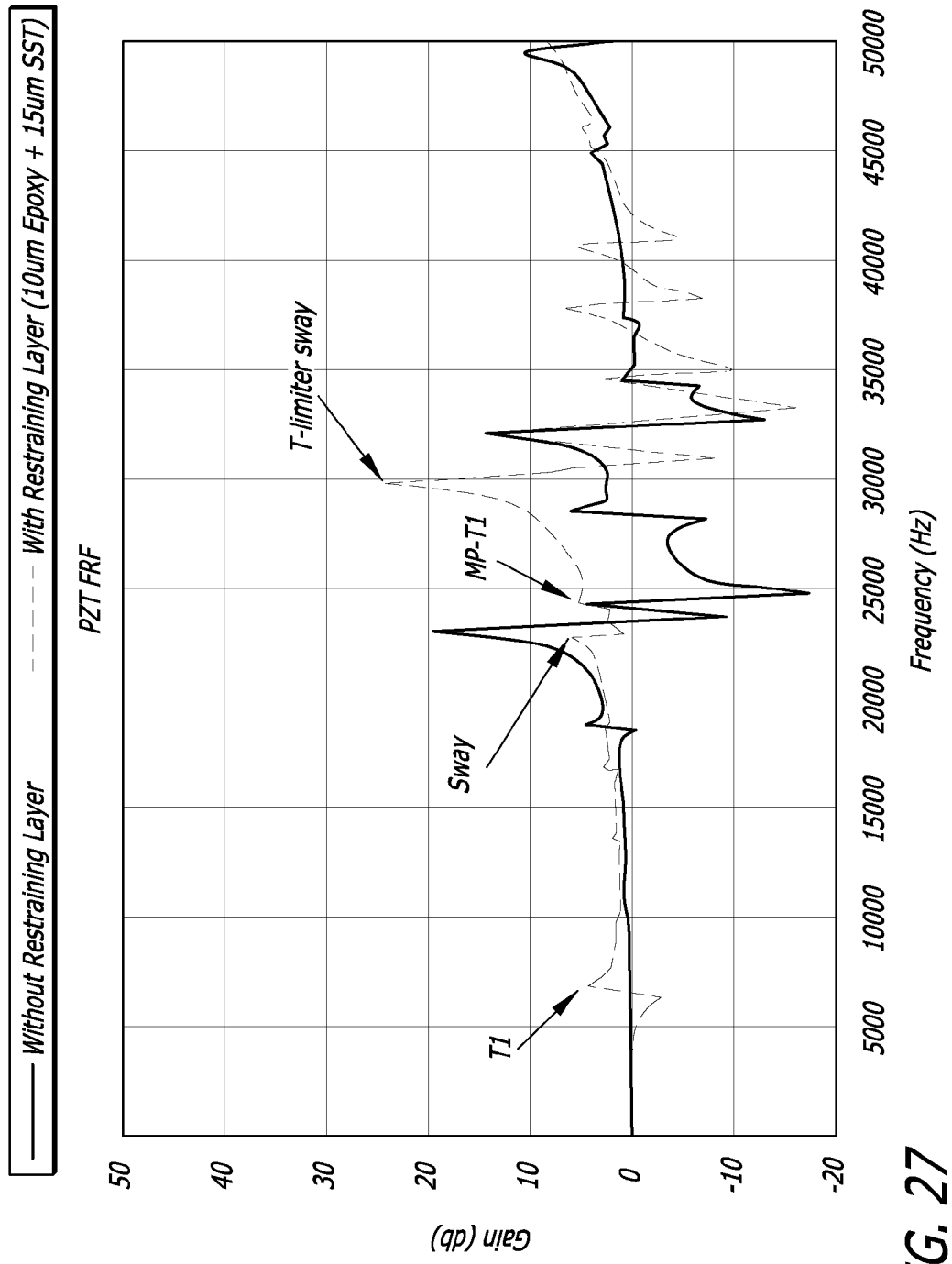
FIG. 27 is a graph of the PZT frequency response function of the suspension of FIG. 25 according to a simulation.

FIG. 27 is a graph of the frequency response of the PZT frequency response function of the suspension of FIG. 26, according to a simulation. The suspension exhibited reduced sway mode gain and torsion mode gain as compared to a simulation without the constraint layer 430. These are advantageous in increasing head positioning control loop bandwidth, which translates into both lower data seek times and lower susceptibility to vibrations.

Figure 28A:
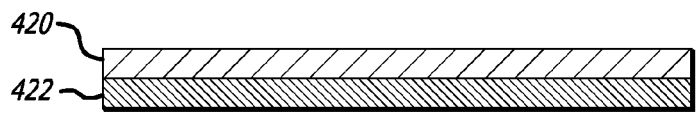
FIGS. 28(a)-28(j) illustrate an exemplary process for manufacturing the PZT microactuator assembly of FIG. 24.
Figure 28B:
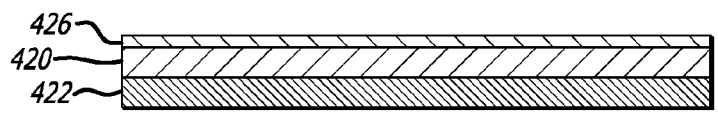
Figure 28C:
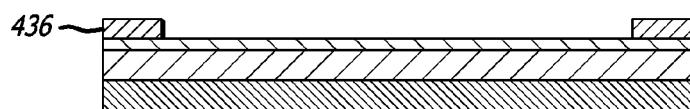
Figure 28D:
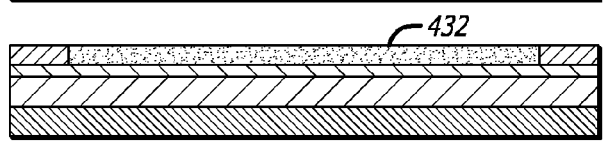
Figure 28E:
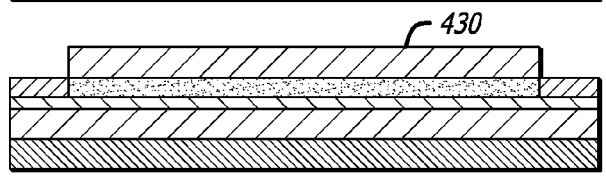
Figure 28F:
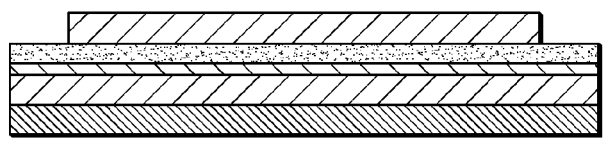
Figure 28G:
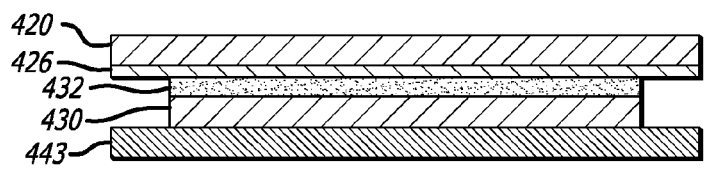
Figure 28H:
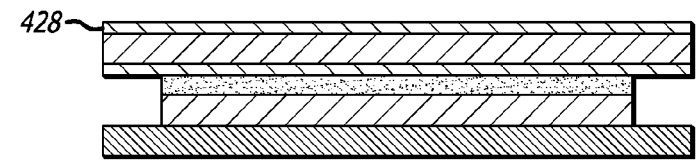
Figure 28I:
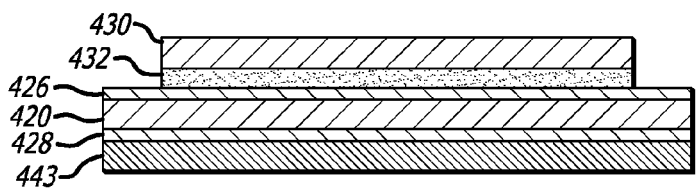
Figure 28J:
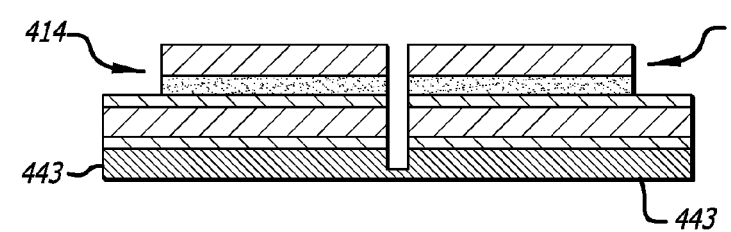

FIGS. 28(a)-28(j) illustrate a process for manufacturing the thin film PZT assembly 114 of FIG. 24. In FIG. 28(a) a bulk PZT wafer 420 is placed onto a transfer tape 422. In FIG. 28(b) the top electrode layer 426 is formed such as by sputtering and/or electrodeposition. In FIG. 28(c) a mask 436 is placed over parts of top electrode 426. In FIG. 28(d) conductive epoxy 432 is applied. In FIG. 28(e) a stainless steel layer that will be constraint layer 430 is applied to the epoxy, which is then cured. In FIG. 27(f) the mask 436 is removed. In FIG. 27(g) the assembly is flipped over and placed down onto a second transfer tape 443. In FIG. 27(h) the bottom electrode layer 428 is formed such as by sputtering and/or electrodeposition. The PZT element 420 is then polarized. In FIG. 27(i) the assembly is then flipped over once more to a third transfer tape 444. IN FIG. 28(j) then assembly is singulated by cutting, to produce finished PZT microactuator assemblies 414.

Figure 29:
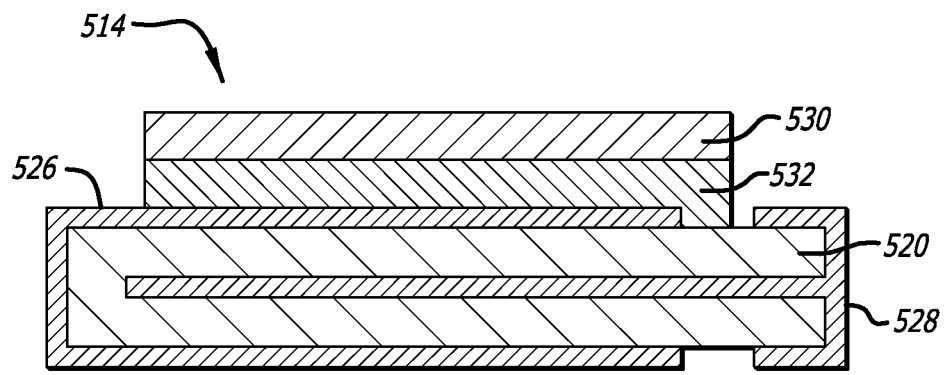
FIG. 29 is a side sectional view of a multi-layer PZT microactuator assembly according to an additional embodiment of the invention in which the PZT is a multi-layer PZT.

FIG. 29 is a side sectional view of a multi-layer PZT assembly 514 according to an additional embodiment of the invention. The assembly includes multi-layer PZT element 520, a first electrode 526 that wraps around the device, and a second electrode 528, and a constraint layer 530 that is bonded to the PZT element 520 by conductive epoxy 532. The figure shows a 2-layer PZT device. More generally, the device could be an n-layer PZT device.

Figure 30:
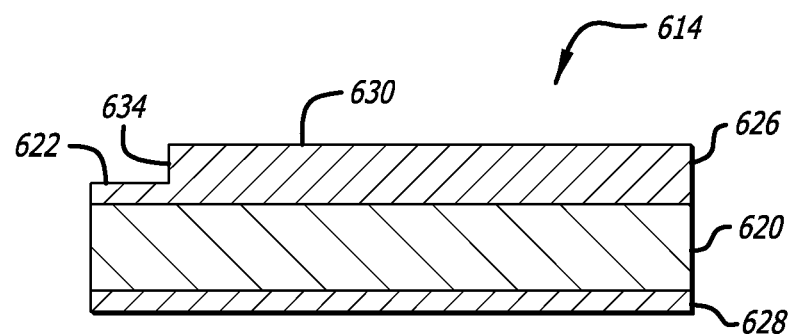
FIG. 30 is a side sectional view of a multi-layer PZT microactuator assembly according to an additional embodiment of the invention in which an extra thick electrode acts as the restraint layer.

FIG. 30 is a side sectional view of a multi-layer PZT microactuator assembly 614 according to an additional embodiment of the invention in which an extra thick electrode acts as the restraint layer. In this embodiment, PZT element 620 has a top electrode 626 and bottom electrode 628. Top electrode 626 includes a thinner first part 622 defining a shelf, and a thicker second part 630 which performs the majority of the restraining function. Step 634 lies at the transition from the thinner first part 622 to the thicker second part 630. Second electrode 626 could be applied to PZT element 620 by a deposition process including masking to create step 634, or by a deposition process with selective removal of material to create the step. Alternatively, second electrode 626 could be a piece of conductive material such as SST that is formed separately and then bonded to PZT element 620. Top electrode 626 could therefore be of the same material, or of a different material, than bottom electrode 628. Thicker second part 630 could be at least 50% thicker than thinner part 622 and/or second electrode 628, or thicker second party 630 could be at least twice as thick as thinner part 622 and/or second electrode 628. As with the embodiment of FIGS. 24-26, the electrical connection could be made to the shelf defined by thinner part 622, with the electrical connection not extending as high as, or higher than, the top surface of the thicker part 630 that defines the restraint layer.

The scope of the invention is not limited to the exact embodiments shown. Variations will be obvious to those skilled in the art after receiving the teachings herein. For example, the restraining layer need not be stainless steel, but can be some other relatively stiff and resilient material. The restraining layer need not be a single layer of one material, but could be composed of different layers of different materials. Although the restraining layer can cover the entire surface or substantially the entire top surface, the restraining could cover less than the entire surface, e.g., more than 90% of the top surface area, more than 75% of the top surface area, more than 50% of the top surface area, or even more than 25% of the top surface area. In embodiments having the step feature, the restraint layer is anticipated to cover less than 95% of the top surface of the microactuator. The constraining layer need not be a single integral layer, but could comprise multiple pieces such as a plurality of constraining strips arranged side by side on the top surface of the PZT, with the strips extending either in the direction of expansion/contraction or perpendicular to it. In one embodiment, the constraining layer could comprise two constraining pieces of stainless steel or other material bonded onto the top surface of the PZT, with the size and location of the two constraining pieces and their bonding generally mirroring the mounting area of two mounting shelves to which the PZT is bonded on its bottom surface. When the overall stiffness added by the restraining layer on the top of the device generally matches the overall stiffness added to the bottom of the device by being bonded to the suspension, and the bonded areas generally mirror each other, the net bending produced should be zero or close to zero. The result will be a PZT microactuator that, as mounted and deployed in a suspension, exhibits virtually no bending upon actuation.

In any and all of the embodiments discussed herein or suggested thereby, the constraining layer could be chosen so as to reduce the PZT bending that would otherwise occur during actuation, or it could be chosen so as to eliminate as much as possible any PZT bending, or it could be chosen so as to reverse the sign of the PZT bending. In applications in which the PZT(s) will be used as hard disk drive microactuator(s), it is envisioned that using a constraining layer to reverse the sign of the bending as shown and described in the illustrative examples above will be desirable in most cases because that increases the effective stroke length. In other applications for PZTs, however, it might not be desirable to reverse the sign. Thus, the invention can be used in general to control both the direction and the amount of the bending of a PZT, regardless of how the PZT is mounted or otherwise affixed to other components within any particular application. Depending on the application and the parameters chosen, the constraining layer can be used to decrease the PZT bending to less than 50% of what it otherwise would be, or to less than 25% of what it otherwise would be, or to reverse the sign of the bending. When the sign is reversed, a PZT that is bonded at or near its ends on its bottom surface and which has a restraining layer on top will bend such that its top surface assumes a concave shape when the PZT is in expansion or extension mode, rather than assuming a convex shape as would a similar PZT that does not have a restraining layer. Similarly, the PZT will assume a convex shape when the PZT is in contraction mode, rather than assuming a concave shape as would a similar PZT that does not have a restraining layer.

For various reasons, PZT elements are sometimes pre-stressed in an application such that when the PZT is not actuated by any voltage it is already bent in one direction or another, i.e., it is already either concave or convex. Of course, such pre-stressed PZTs could be used as microactuators in the present invention. In such a case, the PZT might not bend into a net or absolute concave shape or a net or absolute convex shape. For example, if the PZT is pre-stressed so that it already has a concave shape, upon activation with a positive activation voltage the device might bend into a more concave shape, and upon activation with a negative activation voltage the device might bend into a less concave shape which might be a nominally flat shape or it might be a convex shape. Unless specifically delineated therefore, the terms "concave" and "convex" should be understood in relative terms rather than in absolute terms.

It will be understood that the terms "generally," "approximately," "about," "substantially," and "coplanar" as used within the specification and the claims herein allow for a certain amount of variation from any exact dimensions, measurements, and arrangements, and that those terms should be understood within the context of the description and operation of the invention as disclosed herein.

It will further be understood that terms such as "top," "bottom," "above," and "below" as used within the specification and the claims herein are terms of convenience that denote the spatial relationships of parts relative to each other rather than to any specific spatial or gravitational orientation. Thus, the terms are intended to encompass an assembly of component parts regardless of whether the assembly is oriented in the particular orientation shown in the drawings and described in the specification, upside down from that orientation, or any other rotational variation.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise. Thus, unless expressly stated otherwise, each feature disclosed is one example only of a generic series of equivalent or similar features.

It will be appreciated that the term "present invention" as used herein should not be construed to mean that only a single invention having a single essential element or group of elements is presented. Similarly, it will also be appreciated that the term "present invention" encompasses a number of separate innovations which can each be considered separate inventions. Although the present invention has thus been described in detail with regard to the preferred embodiments and drawings thereof, it should be apparent to those skilled in the art that various adaptations and modifications of the present invention may be accomplished without departing from the spirit and the scope of the invention. Accordingly, it is to be understood that the detailed description and the accompanying drawings as set forth hereinabove are not intended to limit the breadth of the present invention, which should be inferred only from the following claims and their appropriately construed legal equivalents.

We claim:

1. A piezoelectric microactuator comprising:
   a piezoelectric material;
   opposite first and second faces of the piezoelectric microactuator; and
   a restraining layer having a Young's modulus of greater than 50 GPa bonded to the second face of the piezoelectric microactuator by an adhesive without any additional layer therebetween having a stiffness that is substantially less than the stiffness of the restraining layer, the restraining layer altering the bending behavior of the piezoelectric microactuator so as to increase the effective stroke length of the piezoelectric microactuator compared to what the stroke length of the piezoelectric microactuator would be in the absence of the restraining layer.

2. The piezoelectric microactuator of claim 1 wherein the restraining layer is bonded to the second face of the piezoelectric microactuator by said adhesive without any additional layer therebetween having a Young's modulus that is less than 50 GPa.

3. The piezoelectric microactuator of claim 1 wherein the restraining layer is bonded to the second face of the piezoelectric microactuator by said adhesive without any additional layer therebetween of a material having a Young's modulus that is less than 20 GPa.

4. The dual stage actuated suspension of claim 1 wherein the restraining layer has a Young's modulus of greater than 100 GPa.

5. The piezoelectric microactuator of claim 1 wherein the restraining layer comprises stainless steel.

6. The piezoelectric microactuator of claim 1 wherein the restraining layer comprises a ceramic material.

7. A piezoelectric microactuator comprising:
   a piezoelectric material;
   opposite first and second faces of the piezoelectric microactuator; and
   a restraining layer bonded to the second face of the piezoelectric microactuator, the restraining layer comprising the same material as said piezoelectric material but being unpoled, the restraining layer altering the bending behavior of the piezoelectric microactuator so as to increase the effective stroke length of the piezoelectric microactuator compared to what the stroke length of the piezoelectric microactuator would be in the absence of the restraining layer.

8. The piezoelectric microactuator of claim 7 wherein the restraining layer has a Young's modulus of greater than 100 GPa and the restraining layer is bonded directly to the second face of the piezoelectric microactuator by epoxy adhesive without any organic material between the epoxy adhesive and the restraining layer.

9. The piezoelectric microactuator of claim 7 wherein when the piezoelectric microactuator is activated so as to cause it to expand, the piezoelectric microactuator bends such that the second face assumes a concave shape.

10. The piezoelectric microactuator of claim 7 wherein when the piezoelectric microactuator is activated so as to cause it to contract, the piezoelectric microactuator bends such that the second face assumes a convex shape.

11. The piezoelectric microactuator of claim 7 wherein the piezoelectric material has a first portion that is covered by the restraining layer and a second portion that is not covered by the restraining layer.

12. The piezoelectric microactuator of claim 7 wherein the piezoelectric material has a first portion that is covered by the restraining layer and a second portion that is not covered by the restraining layer, and an electrical connection to the piezoelectric material is disposed on the uncovered second portion and electrically bonded thereto.

13. The piezoelectric microactuator of claim 12 wherein the electrical connection on the uncovered first portion rises to a height that is no higher than the restraining layer.

14. A piezoelectric microactuator comprising:
a linear piezoelectric element having a top face and a bottom face;
a material having a Young's modulus of greater than 50 GPA affixed to the top face of the piezoelectric element;
wherein:
when the piezoelectric element is actuated by a voltage that causes the piezoelectric element to expand, the piezoelectric element bends in a direction that causes the top face to become more concave; and
when the piezoelectric element is actuated by a voltage that causes the piezoelectric element to contract, the piezoelectric element bends in a direction that causes the top face to become more convex.

15. The piezoelectric microactuator of claim 14 wherein:
when the piezoelectric element is actuated by a voltage that causes the piezoelectric element to expand, the piezoelectric element bends in a direction that causes the top face to become net concave in shape; and
when the piezoelectric element is actuated by a voltage that causes the piezoelectric element to contract, the piezoelectric element bends in a direction that causes the top face to become net convex in shape.

16. A piezoelectric microactuator assembly comprising:
a thin film PZT material, the PZT material having a first side and an opposite second side;
a stiff material bonded directly to the second side of the PZT material by epoxy adhesive, the stiff material covering at least 50% of the PZT material;
wherein the PZT material has a first portion that is covered by the stiff material and a second portion that is not covered by the stiff material, and
wherein the stiff material comprises an insulating material and the insulating material has an electrically conductive via therethrough.

17. The piezoelectric microactuator of claim 16 wherein the stiff material comprises stainless steel.

18. The piezoelectric microactuator of claim 16 wherein the stiff material is an insulating material.

19. The piezoelectric microactuator of claim 18 wherein the stiff material comprises silicon.

20. The piezoelectric microactuator of claim 18 further comprising an electrical connection to the PZT material disposed on the uncovered second portion and electrically bonded thereto.

21. A piezoelectric microactuator comprising:
a piezoelectric material, the piezoelectric microactuator having opposite first and second faces; and
a restraining layer bonded to the second face of the piezoelectric microactuator, the restraining layer being smaller than the second face leaving a portion of the second face uncovered by the restraining layer;
wherein the restraining layer and its bonding comprises at least one of:
a stainless steel layer bonded directly to the second face of the piezoelectric microactuator by epoxy adhesive; and
an unactivated piezoelectric layer affixed to the piezoelectric material, the unactivated piezoelectric layer exhibiting less than 10% as much piezoelectric behavior as the piezoelectric material when the microactuator is activated by application of a voltage thereto;
wherein the restraining layer alters the bending behavior of the piezoelectric microactuator so as to increase the effective stroke length of the piezoelectric microactuator compared to what the stroke length of the piezoelectric microactuator would be in the absence of the restraining layer.

22. The piezoelectric microactuator of claim 21 further comprising:
an electrical connection to the piezoelectric material physically and electrically bonded to the uncovered portion of the piezoelectric microactuator's second face.

* * * * *